US012658406B2

(12) United States Patent
Biberger

(10) Patent No.:  US 12,658,406 B2
(45) Date of Patent:  Jun. 16, 2026

(54) DETERMINING A POSITION OF AN OBJECT IN A BEAM APPARATUS

(71) Applicant: Carl Zeiss Microscopy GmbH, Jena (DE)

(72) Inventor: Josef Biberger, Wildenberg (DE)

(73) Assignee: Carl Zeiss Microscopy, GmbH, Jena (DE)

( * ) Notice: Subject to any disclaimer, the term of this patent is extended or adjusted under 35 U.S.C. 154(b) by 394 days.

(21) Appl. No.: 18/522,313

(22) Filed: Nov. 29, 2023

(65) Prior Publication Data

US 2024/0258068 A1     Aug. 1, 2024

(30) Foreign Application Priority Data

Dec. 12, 2022    (DE) ..................... 10 2022 132 951.8

(51) Int. Cl.
*H01J 37/304*       (2006.01)
*H01J 37/22*        (2006.01)
*H01J 37/28*        (2006.01)

(52) U.S. Cl.
CPC ........ *H01J 37/3045* (2013.01); *H01J 37/222* (2013.01); *H01J 37/28* (2013.01);
(Continued)

(58) Field of Classification Search
CPC .. H01J 37/00; H01J 37/02; H01J 37/26; H01J 37/28; H01J 37/222; H01J 37/3045; H01J 37/20; H01J 2237/006; H01J 2237/20214; H01J 2237/20285; H01J 2237/24578; H01J 2237/2809; G01N 23/00; G01N 23/04;
(Continued)

(56) References Cited

U.S. PATENT DOCUMENTS 8,536,525 B2     9/2013 Blackwood et al.
2004/0036031 A1  2/2004 Rose et al.
(Continued)

FOREIGN PATENT DOCUMENTS

DE    10 2009 001 910 A1    9/2010
DE    10 2011 076 893 A1    12/2012
(Continued)

OTHER PUBLICATIONS

German Office Action for Application No. 10 2022 132 951.8, Dated Sep. 28, 2023.

*Primary Examiner* — Jason L Mccormack
(74) *Attorney, Agent, or Firm* — Westborough IP Group, LLC

(57)    ABSTRACT

A position of an object in a beam apparatus is determined where the beam apparatus has a processor unit which is used for processing, imaging and/or analyzing the object. Determining the position of the object includes providing firstly a predefinable region of the object and secondly a marking in the beam apparatus. The predefinable region has a first position in relation to the marking. The first position is given by a first distance and a second distance. Determining the position of the object also includes rotating the object or rotating a capture device of the beam apparatus, determining a further second distance, and determining a second position of the predefinable region of the object in relation to the marking using the first distance, the second distance and the further second distance.

28 Claims, 14 Drawing Sheets

(52) U.S. Cl.
CPC ................ *H01J 2237/20214* (2013.01); *H01J*
*2237/24578* (2013.01)

(58) Field of Classification Search
CPC ............. G01N 23/20; G01N 23/20008; G01N
23/20025; G01N 23/2204; G01N
23/2251; G01N 23/2255; G01N
2223/418; G01N 2223/6116
USPC ................................. 250/306, 307, 310, 311
See application file for complete search history.

(56) References Cited

U.S. PATENT DOCUMENTS

| | | | |
|---|---|---|---|
| 2012/0112063 A1 | 5/2012 | Schertel | |
| 2012/0305797 A1 | 12/2012 | Preikszas | |
| 2012/0328151 A1* | 12/2012 | Warschauer | .......... G06T 7/0004 |
| | | | 382/103 |
| 2014/0061159 A1* | 3/2014 | Asahata | .................. H01J 37/02 |
| | | | 216/85 |
| 2014/0158884 A1 | 6/2014 | Paluszynski | |
| 2016/0118216 A1 | 4/2016 | Doemer et al. | |

FOREIGN PATENT DOCUMENTS

| | | | |
|---|---|---|---|
| DE | 10 2012 109 296 A1 | 4/2014 | |
| DE | 10 2014 220 122 A1 | 4/2016 | |
| WO | WO 2002/067286 A2 | 8/2002 | |

* cited by examiner

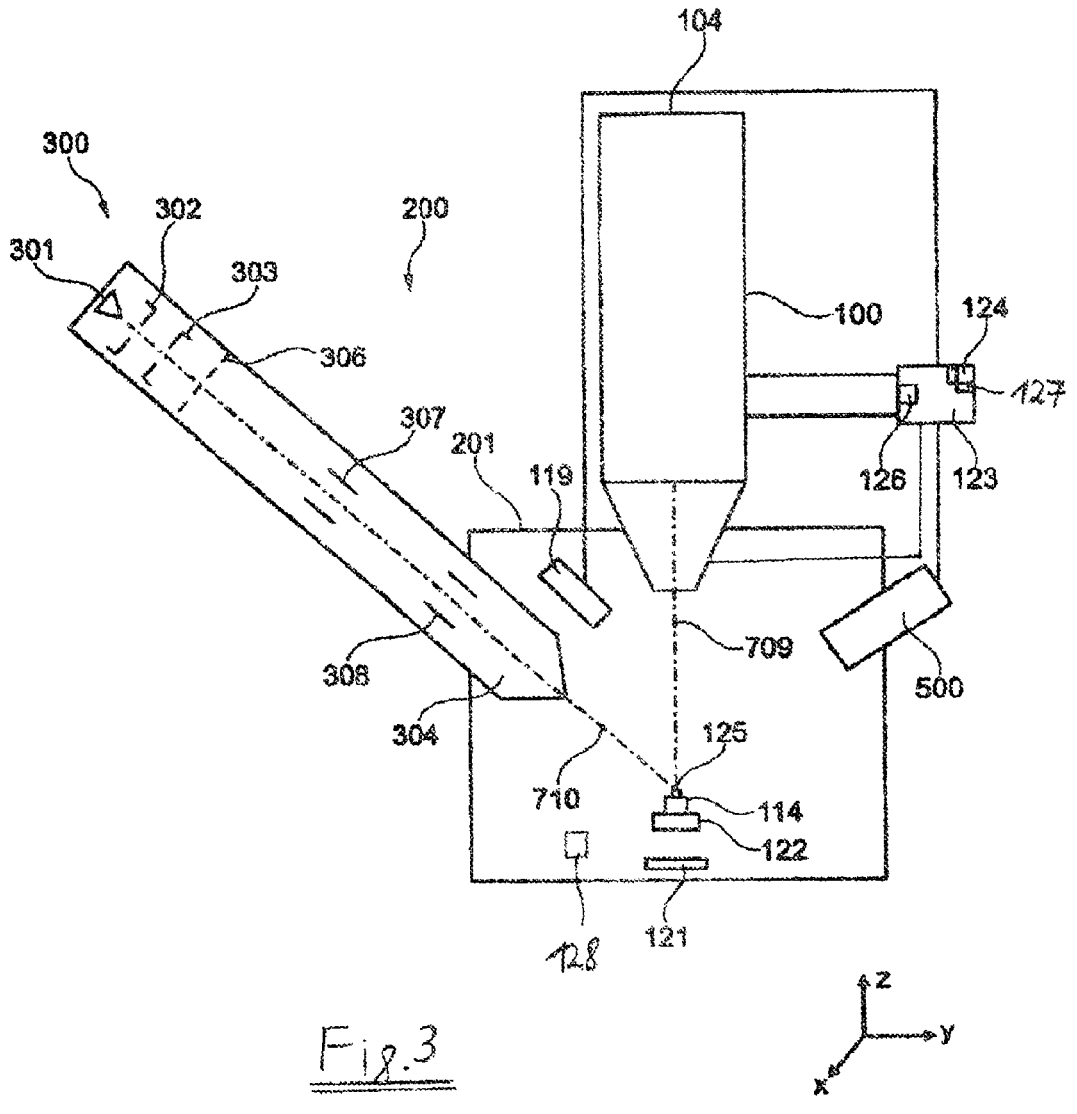
_Fig.3_

PROVIDING A PREDEFINABLE REGION
OF AN OBJECT AND A MARKING    S1

ROTATING THE OBJECT AND/OR
THE CAPTURE DEVICE    S2

DETERMINING A FURTHER SECOND DISTANCE    S3

DETERMINING THE POSITION OF THE
PREDEFINABLE REGION    S4

S3

S3A

S4

S4

S5

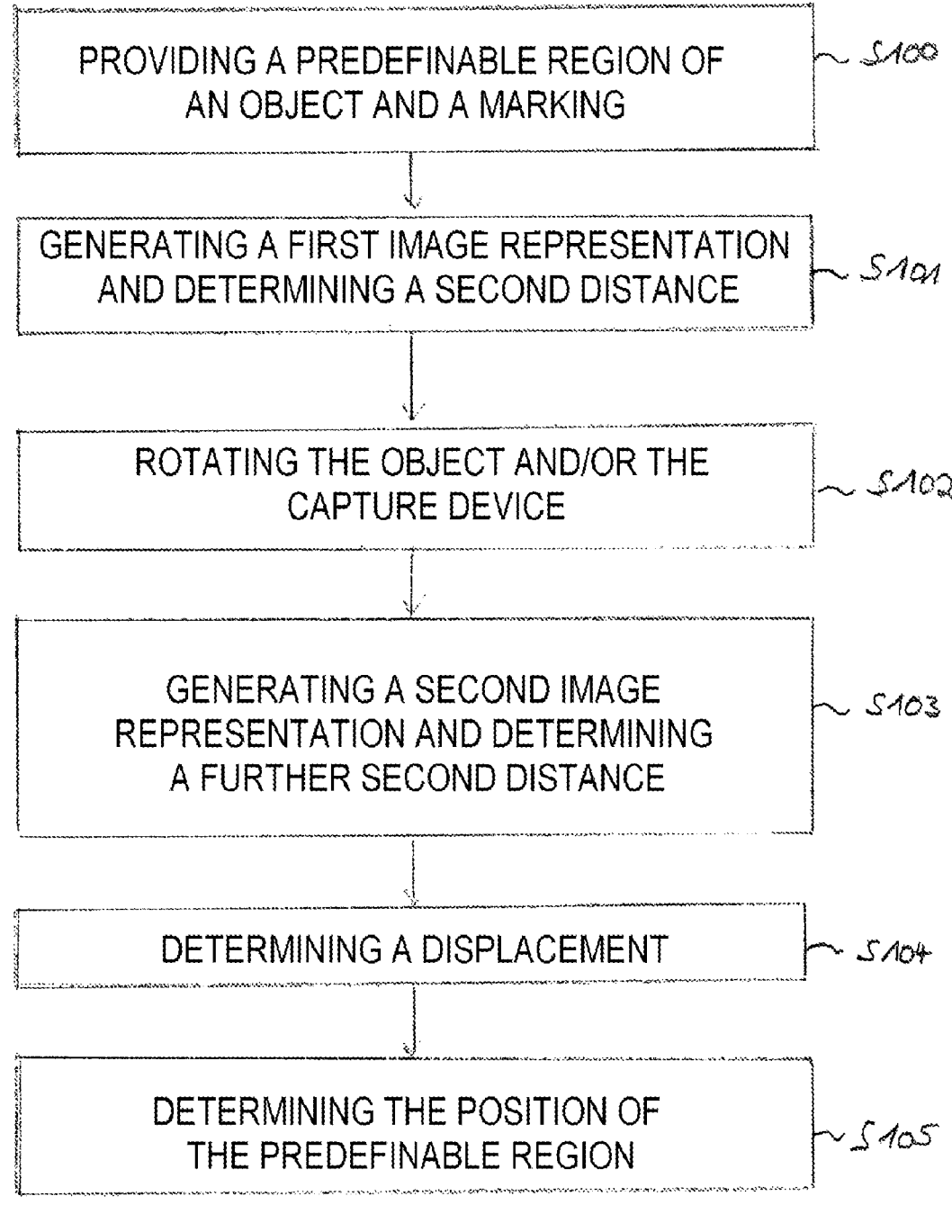

PROVIDING A PREDEFINABLE REGION OF AN OBJECT AND A MARKING ~ S100

GENERATING A FIRST IMAGE REPRESENTATION AND DETERMINING A SECOND DISTANCE ~ S101

ROTATING THE OBJECT AND/OR THE CAPTURE DEVICE ~ S102

GENERATING A SECOND IMAGE REPRESENTATION AND DETERMINING A FURTHER SECOND DISTANCE ~ S103

DETERMINING A DISPLACEMENT ~ S104

DETERMINING THE POSITION OF THE PREDEFINABLE REGION ~ S105

Fig. 15

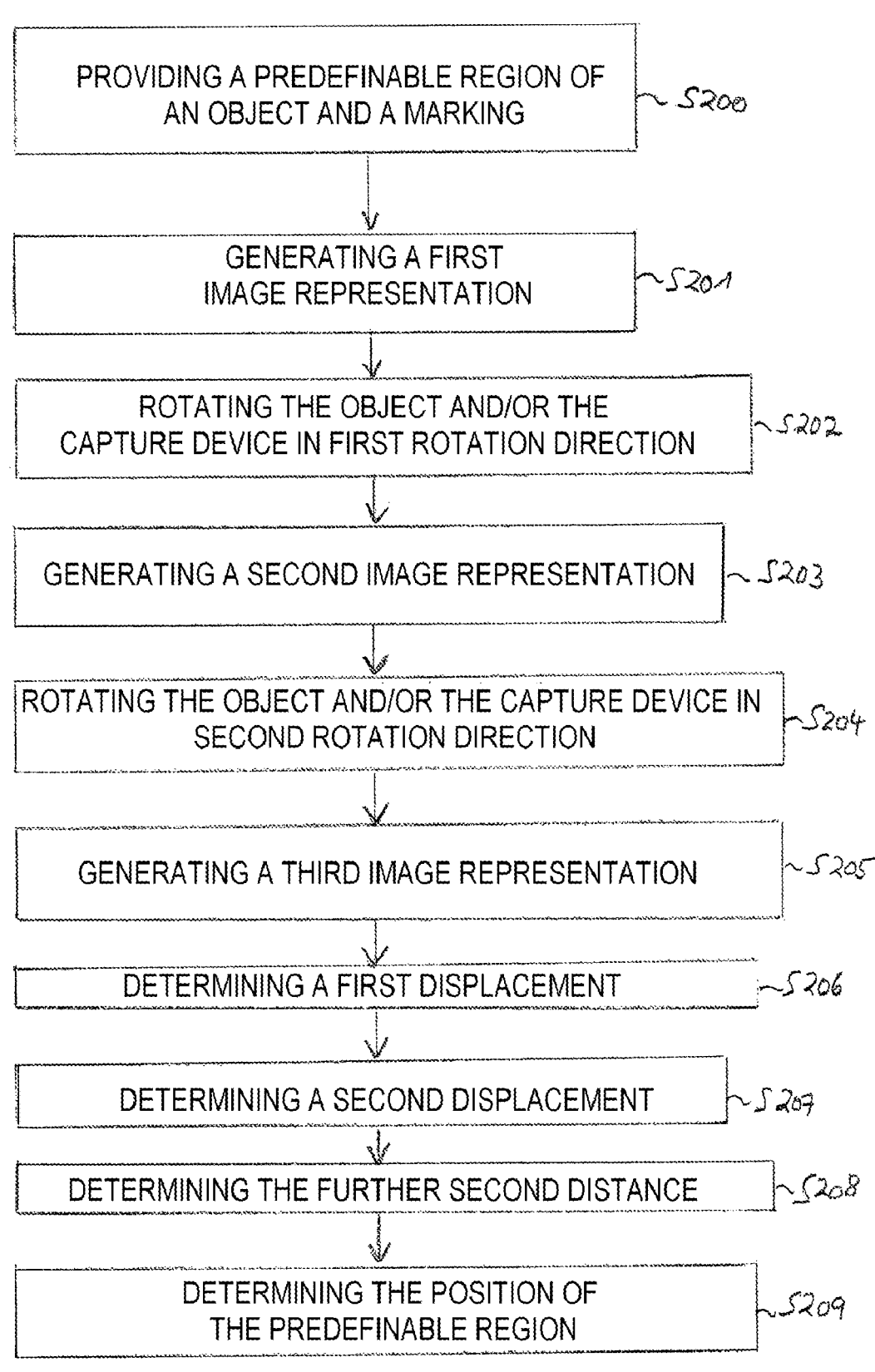

PROVIDING A PREDEFINABLE REGION OF AN OBJECT AND A MARKING ~S200

GENERATING A FIRST IMAGE REPRESENTATION ~S201

ROTATING THE OBJECT AND/OR THE CAPTURE DEVICE IN FIRST ROTATION DIRECTION ~S202

GENERATING A SECOND IMAGE REPRESENTATION ~S203

ROTATING THE OBJECT AND/OR THE CAPTURE DEVICE IN SECOND ROTATION DIRECTION ~S204

GENERATING A THIRD IMAGE REPRESENTATION ~S205

DETERMINING A FIRST DISPLACEMENT ~S206

DETERMINING A SECOND DISPLACEMENT ~S207

DETERMINING THE FURTHER SECOND DISTANCE ~S208

DETERMINING THE POSITION OF THE PREDEFINABLE REGION ~S209

Fig. 16

DETERMINING A POSITION OF AN OBJECT IN A BEAM APPARATUS

CROSS-REFERENCE TO RELATED APPLICATIONS

This application claims priority to the German patent application No. 10 2022 132 951.8, filed on 12 Dec. 2022, which is incorporated herein by reference.

TECHNICAL FIELD

This application relates to determining a position of an object in a beam apparatus, and more particularly to determining a position of an object in a beam apparatus such as a particle beam apparatus and/or in a light microscope.

BACKGROUND

Electron beam apparatuses, in particular a scanning electron microscope (also referred to as SEM below) and/or a transmission electron microscope (also referred to as TEM below), are used to examine objects (samples) in order to gain knowledge about the properties and the behavior under certain conditions.

In an SEM, an electron beam (also referred to as primary electron beam below) is generated using a beam generator and focused on an object to be examined by way of a beam guiding system. The primary electron beam is guided in a raster manner over a surface of the object to be examined using a deflection device. In the process, the electrons of the primary electron beam interact with the object to be examined. As a consequence of the interaction, in particular, electrons are emitted by the object (so-called secondary electrons) and electrons of the primary electron beam are backscattered (so-called backscattered electrons). The secondary electrons and backscattered electrons are detected and used for image generation. An image representation of the object to be examined is thus obtained. Furthermore, interaction radiation, for example x-ray radiation and cathodoluminescent light, is generated as a consequence of the interaction. In particular, the interaction radiation is used to analyze the object.

In the case of a TEM, a primary electron beam is likewise generated using a beam generator and focused on an object to be examined using a beam guiding system. The primary electron beam passes through the object to be examined. When the primary electron beam passes through the object to be examined, the electrons of the primary electron beam interact with the material of the object to be examined. The electrons passing through the object to be examined are imaged on a luminescent screen or on a detector (for example a camera) by a system consisting of an objective and a projection unit. Here, imaging can also take place in the scanning mode of a TEM. Usually, such a TEM is referred to as STEM. Additionally, the use of a further detector to detect electrons backscattered at the object to be examined and/or secondary electrons emitted by the object to be examined may be provided, in order to image an object to be examined.

Furthermore, the prior art discloses the use of combination apparatuses for examining objects, in which both electrons and ions can be guided onto an object to be examined. By way of example, it is known to additionally equip an SEM with an ion beam column. An ion beam generator arranged in the ion beam column is used to generate ions that are used for the preparation of an object (for example ablating material of the object or applying material to the object) or else for imaging. The SEM serves here in particular for observing the preparation, but also for further examination of the prepared or unprepared object.

In a further known particle beam apparatus, material is applied to the object using the feed of a gas, for example. The known particle beam apparatus is a combination apparatus that provides both an electron beam and an ion beam. The particle beam apparatus includes an electron beam column and an ion beam column. The electron beam column provides an electron beam that is focused on an object. The object is arranged in a sample chamber kept under vacuum. The ion beam column provides an ion beam that is likewise focused on the object. By way of example, a layer of the surface of the object is removed using the ion beam. A further surface of the object is exposed once the layer has been removed. Using a gas feed device, a gaseous precursor substance—a so-called precursor—can be admitted into the sample chamber. It is known to embody the gas feed device with an acicular device, which can be arranged very close to a position of the object at a distance of a few µm, such that the gaseous precursor substance can be guided to the position as accurately as possible and with a high concentration. As a result of the interaction of the ion beam with the gaseous precursor substance, a layer of a substance is deposited on the surface of the object. By way of example, it is known for gaseous phenanthrene to be admitted as gaseous precursor substance into the sample chamber using the gas feed device. Essentially a layer of carbon or a carbon-containing layer then deposits on the surface of the object. It is also known to use a gaseous precursor substance that includes metal in order to deposit a metal or a metal-containing layer on the surface of the object. However, the depositions are not limited to carbon and/or metals. Rather, any desired substances can be deposited on the surface of the object, for example semiconductors, non-conductors or other compounds.

Furthermore, it is known for the gaseous precursor substance to be used for ablating material of the object upon interaction with a particle beam.

The application of material to the object and/or the ablation of material from the object are/is used for arranging a marking on the object, for example. In the prior art, the marking is used for example to position the electron beam and/or the ion beam.

To carry out a high-resolution analysis of material structures of an object in a TEM or in an SEM with a transmission detector, it is known to prepare the object in such a way that the thickness of the object is less than 100 nm since the electrons of an electron beam have a range of typically 1000 nm in solid materials in the case of a transmission of the electrons through the object. Upon entry into the object, the electrons typically have an energy of a few 10 keV to a few 100 keV. The thickness of the object of less than 100 nm ensures that a predominant portion of the electrons passes through the object and is able to be detected using a detector.

The prior art discloses a practice of processing the object using an ion beam in order to attain a thickness of the object of less than 100 nm, for example a thickness ranging from 1 nm to 80 nm or from 1 nm to 50 nm. The processing of the object using the ion beam can be observed by imaging the object using an electron beam.

A method, which is known from the prior art, for generating an object intended for examination with a TEM or with an SEM using a transmission detector is described below. Initially, a portion of a material piece with extents in the millimeter range, for example, is exposed in the material piece using an ion beam and extracted from the material piece. By way of example, the portion has a thickness of a few micrometers (in particular 3 μm to 6 μm), for example, and a length of the few 10 μm (in particular 30 μm to 80 μm), for example. Subsequently, the portion is fastened to a micromanipulator and lifted out of the material piece. Thereupon, the portion is fastened to a TEM object holder (also referred to as a "TEM grid"). Using an ion beam guided to the portion, material of the portion is ablated until the portion or at least a region of the portion has a thickness of less than 100 nm. When ablating material from the portion, the TEM object holder is rotated about a rotation axis, initially through 1° to 2° in a first direction from an initial position, in order to ensure good ablation of material on a first side of the portion. Then, the TEM object holder is rotated about the rotation axis, through 1° to 2° in a second direction from the initial position, in order to ensure good ablation of material on a second side of the portion. The first side and the second side of the portion are arranged opposite to and spaced apart from one another. So that the TEM object holder is rotatable, the TEM object holder is arranged on a movable object stage. The object stage includes mechanical movement units which facilitate a rotation of the TEM object holder.

In respect of the prior art, reference is made to U.S. Pat. No. 8,536,525 B2.

It is known from the prior art to monitor and/or to set the position of an object using at least one marking or a distinctive structure on the surface of the object. To put it more precisely, the position of a predefinable region of the object is monitored and/or set using the marking or the distinctive structure on the surface of the object. The marking (or the distinctive structure) is used for orientation purposes in this case, such that it is possible to determine the relative position of the predefinable region of the object with respect to the marking (or with respect to the distinctive structure). On the basis of the relative position of the predefinable region of the object with respect to the marking (or with respect to the distinctive structure), it is also possible to determine the position of the predefinable region of the object in a coordinate system of the particle beam apparatus (for example in the coordinate system of the object stage).

After a movement of the object along at least one of three translational axes along which the object stage is movable, inaccuracies of the mechanical system of the movement units of the object stage on which the object is arranged may give rise to an unwanted relative displacement of the position of the predefinable region in relation to a beam of a beam apparatus which is intended to be used for imaging, processing and/or analyzing the object. By generating a first image representation both of the predefinable region of the object and of the marking (or of the distinctive structure) before the movement of the object and by generating a second image representation both of the predefinable region of the object and of the marking (or of the distinctive structure) after the movement of the object, it is possible to determine a displacement of the position of the predefinable region of the object in the first image representation with respect to the position of the predefinable region of the object in the second image representation by way of a comparison of the position of the predefinable region of the object in the first image representation with the position of the predefinable region of the object in the second image representation. In this case, the displacement of the position of the predefinable region of the object in the first image representation with respect to the position of the predefinable region of the object in the second image representation is determined using the relative position of the predefinable region of the object with respect to the marking (or with respect to the distinctive region) in the first image representation and using the relative position of the predefinable region of the object with respect to the marking (or with respect to the distinctive region) in the second image representation. After determining the aforementioned displacement, it is possible to ascertain whether, after the movement along at least one of three translational axes along which the object stage is movable, the predefinable region of the object is situated at a desired position relative to the beam of the beam apparatus or is situated in a different position than the desired position relative to the beam of the beam apparatus. If the predefinable region of the object is situated at a different position than the desired position relative to the beam of the beam apparatus, it is possible, using the determined displacement of the position of the predefinable region of the object in the first image representation with respect to the position of the predefinable region of the object in the second image representation, to bring the predefinable region of the object into the desired position relative to the beam of the beam apparatus by movement of the object along at least one of three translational axes along which the object stage is movable.

The known method leads to sufficiently good determinations of the position of the predefinable region of the object relative to the beam of the beam apparatus provided that, firstly, the marking (or the distinctive structure) and the predefinable region of the object lie in one plane, such that the marking (or the distinctive structure) and the predefinable region of the object are basically at the same working distance from an objective lens of the beam apparatus, and, secondly, the movement of the object takes place in this plane. However, even if (i) the predefinable region of the object, firstly, and the marking (or the distinctive structure), secondly, are not at the same working distance from the objective lens of the beam apparatus and (ii) the movement of the object is not caused by a tilting (rotation) about a tilt axis of the object stage, the known method leads to adequate determinations of the position of the predefinable region of the object relative to the beam of the beam apparatus. If the object stage and thus the object are however tilted about a tilt axis of the object stage, it may happen that the position of the predefinable region of the object relative to the position of the marking (or of the distinctive structure) changes in a projection since the marking (or the distinctive structure) and the predefinable region of the object are at different distances from the objective lens of the beam apparatus. To put it another way, the marking (or the distinctive structure) and the predefinable region of the object are at different working distances from the objective lens of the beam apparatus. Furthermore, the change in the relative position occurs if the marking (or the distinctive structure) and the predefinable region of the object are at different distances perpendicular to the tilt axis. When setting the desired position of the predefinable region of the object relative to the beam of the beam apparatus, it is then possible for errors to occur which ultimately have the effect that the predefinable region of the object is not positioned in the desired position. This may lead to an unwanted relative displacement of the position of the beam of the beam apparatus in relation to the predefinable region of the object. In this respect, after the tilting of the object, the beam of the beam apparatus might no longer impinge on the object at the point at which the beam of the beam apparatus had been focused before the tilting of the object.

SUMMARY OF THE INVENTION

The system described herein addresses the problem of determining a position of an object in a beam apparatus and enables an accurate determination of a position of an object even after a tilting (i.e. after a rotation) about an axis.

The method according to the system described herein serves for determining a position of an object in a beam apparatus, in particular a particle beam apparatus for processing, imaging and/or analyzing an object. Furthermore, the beam apparatus can be configured as a laser beam apparatus for processing, imaging and/or analyzing an object and/or as a light microscope for imaging and/or analyzing an object. The beam apparatus has a processor unit and provides a beam which is used for examining, imaging and/or analyzing the object. If the beam apparatus is configured as a particle beam apparatus, the beam apparatus has for example at least one beam generator for generating a particle beam with charged particles. The charged particles are electrons or ions, for example.

The method according to the system described herein involves providing firstly a predefinable region of an object and secondly a marking in the beam apparatus. The marking can be arranged for example on the object and/or on an object holder on which the object is arranged. In particular, the marking is configured as a distinctive structure on the object and/or on the object holder. In one embodiment of the method according to the system described herein, provision is made for the marking to be generated by ablating material from the object and/or from the object holder. In addition or as an alternative thereto, provision is made for the marking to be generated by applying material to the object and/or to the object holder. By way of example, provision is made for the beam of the beam apparatus, in particular a particle beam or a laser beam, to be used for producing the marking.

Provision is made for the predefinable region of the object to have a first position in relation to the marking. To put it another way, the predefinable region of the object has a first position relative to the marking. The first position is given by a first distance and a second distance, where the first distance is given as the distance between the predefinable region of the object and a first straight line running through the marking, and where the second distance is given as the distance between the predefinable region of the object and a second straight line running through the marking. The first straight line and the second straight line are arranged at a first angle with respect to one another, which first angle is different than 0° and 180°. In one embodiment of the system described herein, provision is made, for example, for the first distance to extend along a first axis of a coordinate system and for the second distance to extend along a second axis of the coordinate system. In particular, the coordinate system is configured as a two-dimensional or three-dimensional coordinate system. In one embodiment of the system described herein, the first distance is a vertical distance, for example. Furthermore, the second distance is a horizontal distance, for example. The first distance and the second distance are determined for example in one embodiment of the method according to the system described herein or have been determined for example before the method according to the system described herein is carried out. In particular, the first distance and/or the second distance can be determined by manual measurement using an image representation both of the predefinable region of the object and of the marking. In addition or as an alternative thereto, the first distance and/or the second distance can be determined by using image recognition software.

In the method according to the system described herein, provision is made for at least one of the following steps to be carried out:

(i) rotating the object arranged on an object holder using an object stage, where the object holder is arranged on the object stage, and where the object stage is rotated about a first rotation axis of the object stage and by a predefinable first rotation angle, where the first rotation axis is aligned at a second angle with respect to an axis of the beam apparatus, where the second angle is different than 0° and 180°. The first rotation axis is a tilt axis, in particular. To put it another way, the object stage and thus the object are tilted about the tilt axis. By way of example, the axis of the beam apparatus is an optical axis of the beam apparatus along which a beam of the beam apparatus is guided to the object.

In addition or as an alternative thereto, the object stage is movable along a first axis, along a second axis and/or along a third axis, where the first axis, the second axis and the third axis are aligned perpendicular to one another in each case, for example. Furthermore, provision is made for the object stage to be rotatable about the first rotation axis. For example, the aforementioned rotation includes a tilting of the object stage about the first rotation axis. In particular, provision is made for the object stage—and hence also the object arranged on the object holder—to be rotated about the first rotation axis, through 0.5° to 5°, in particular through 1° to 3° or through 1° to 2°, in a first direction and/or a second direction proceeding from an initial position. The aforementioned range boundaries of the angular ranges are included in the angular ranges. Explicit reference is made to the fact that the invention is not restricted to the aforementioned angular ranges. Rather, any angular range suitable for the invention can be used. In one embodiment of the method according to the system described herein, provision is additionally made for the object stage also to be rotatable about at least one further rotation axis. By way of example, the first rotation axis and the further rotation axis are aligned perpendicular to one another. In a further embodiment of the system described herein, the object stage is configured as an elongate manipulator.

(ii) rotating a capture device of the beam apparatus about a second rotation axis and by a predefinable second rotation angle. By way of example, the capture device is an eye of a user of the beam apparatus. In addition or as an alternative thereto, provision is made for the capture device to be a camera unit of the beam apparatus. Rotating the capture device of the beam apparatus about the second rotation axis means that an axis of the capture device along which both the predefinable region of the object and the marking are viewed is rotated as well. The capture device is basically rotated in relation to the axis of the beam apparatus (i.e. relative to the axis of the beam apparatus). A change of perspective occurs in relation to the axis of the beam apparatus. To put it another way, the capture device views the predefinable region of the object and the marking from a first perspective before the capture device is rotated. After the capture device has been rotated, the capture device views the predefinable region of the object and the marking from a second perspective.

In the method according to the system described herein, provision is now made for rotating the object and/or rotating the capture device to be followed by determining a further second distance between the predefinable region of the object and the second straight line using the processor unit. Furthermore, rotating the object and/or rotating the capture device are/is followed by determining a second position of the predefinable region of the object in relation to the marking (i.e. relative to the marking) using the first distance, the second distance and the further second distance. The second position of the predefinable region of the object basically corresponds to the position adopted by the predefinable region relative to the marking after rotating the object and/or after rotating the capture device.

According to the system described herein, it is recognized that a determination of the position of the predefinable region of the object, even after a tilting of the object about an axis, can be attained sufficiently well as a result if first of all there is a referencing of the first position of the predefinable region of the object relative to the marking by way of knowledge of the first distance and the second distance. As explained above, the first distance can extend along a first axis of a coordinate system. Furthermore, the second distance can extend along a second axis of the coordinate system. In particular, the coordinate system is configured as a two-dimensional or three-dimensional coordinate system. The first distance is a vertical distance, for example. Furthermore, the second distance is a horizontal distance, for example. In order to determine the second (i.e. the actual) position of the predefinable region of the object relative to the marking after a rotation of the object and/or after a rotation of the capture device, it is then sufficient, according to the system described herein, to ascertain the further second distance between the predefinable region of the object and the second straight line. According to the system described herein, it is recognized that in order to determine the position of the predefinable region of the object relative to the marking both before at least one of the aforementioned rotations and after at least one of the aforementioned rotations, it is always possible to view both the predefinable region of the object and the marking along the second straight line. The second straight line runs for example along the axis of the beam apparatus or along an axis of the capture device. On account of the rotation of the predefinable region of the object and/or the rotation of the capture device, there is a displacement of the position of the predefinable region of the object relative to the marking along the axis of the beam apparatus or along the axis of the capture device. For the determination of the second (i.e. the actual) position of the predefinable region of the object relative to the marking, it is then sufficient, in addition to the initial referencing, to use the further second distance between the predefinable region and the second straight line. To put it another way, both a first working distance between the predefinable region of the object and a focusing unit of the beam apparatus and a second working distance between the marking and the focusing unit of the beam apparatus change on account of the rotation of the predefinable region of the object and/or the rotation of the capture device. According to the system described herein, it is recognized that, for the determination of the second (i.e. the actual) position of the predefinable region of the object relative to the marking, it is then sufficient, in addition to the initial referencing (i.e. establishing or ascertaining the first distance and the second distance), to use the further second distance between the predefinable region and the second straight line for determining the actual position of the predefinable region of the object.

The system described herein thus ensures the determination of the actual position of a predefinable region of the object even after a tilting of the object about an axis. It is thus possible to establish whether, after the tilting of the object, the predefinable region of the object (or the object as such) is situated at a desired position. If this is not the case, it is possible, on the basis of the system described herein, to determine a displacement between the determined second position of the predefinable region of the object and the desired position of the predefinable region of the object. This displacement between the determined second position of the predefinable region of the object and the desired position of the predefinable region of the object is then compensated for. To put it another way, using the determined displacement between the determined second position of the predefinable region of the object and the desired position of the predefinable region of the object, the predefinable region of the object is brought into a new position (for example into the desired position) relative to the beam of the beam apparatus. This is done for example by moving the object stage and/or the beam of the beam apparatus. The beam is moved for example using at least one deflection device of the beam apparatus. Consequently, it is then possible to position the predefinable region of the object into a new position relative to the beam of the beam apparatus using the processor unit depending on the determined second position of the predefinable region of the object by moving the object stage and/or by moving the beam.

In one embodiment of the method according to the system described herein, provision is additionally or alternatively made for, after rotating the object and/or after rotating the capture device, determining a further first distance between the predefinable region of the object and the first straight line running through the marking. Furthermore, determining the second position of the predefinable region of the object relative to the marking is then also carried out using the further first distance. Consequently, in this embodiment of the method according to the system described herein, a further parameter, namely the further first distance, is used in addition to the further second distance for determining the second position of the predefinable region of the object.

As mentioned above, the first distance is the distance between the predefinable region of the object and the first straight line running through the marking. In one embodiment of the system described herein, the first distance is for example the distance of a midpoint of the predefinable region of the object perpendicular to the first straight line. In particular, the midpoint is a center of area, a centroid of area or a center of mass of the predefinable region of the object. As an alternative thereto, the first distance is the shortest distance of an edge of the predefinable region of the object perpendicular to the first straight line. The first distance is not restricted to the aforementioned examples. Rather, the first distance can be any distance between the predefinable region of the object and the first straight line which is suitable for the system described herein. With regard to possible definitions of the further first distance, the statements made above with regard to the first distance are applicable, mutatis mutandis.

As mentioned above, the second distance is the distance between the predefinable region of the object and the second straight line running through the marking. In one embodiment of the system described herein, the second distance is for example the distance of a midpoint of the predefinable region of the object perpendicular to the second straight line. In particular, the midpoint is a center of area, a centroid of area or a center of mass of the predefinable region of the object. As an alternative thereto, the second distance is the shortest distance of an edge of the predefinable region of the object perpendicular to the second straight line. The second distance is not restricted to the aforementioned examples. Rather, the second distance can be any distance between the predefinable region of the object and the second straight line which is suitable for the invention. With regard to possible definitions of the further second distance, the statements made above with regard to the second distance are applicable, mutatis mutandis.

In a further embodiment of the method according to the system described herein, provision is additionally or alternatively made for the first straight line and the second straight line to be chosen in such a way that the first straight line and the second straight line are aligned at the first angle of 90° with respect to one another. In addition or as an alternative thereto, provision is made for the first straight line and the second straight line to be chosen in such a way that the first straight line and/or the second straight line run(s) through a center of the marking. By way of example, the center of the marking is a centroid of area or a center of mass. Yet again in addition or as an alternative thereto, provision is made for the first straight line and the second straight line to be chosen in such a way that an alignment and a position of the first straight line and/or an alignment and position of the second straight line do not change after rotating the object and/or rotating the capture device. By way of example, the first straight line and the second straight line are each axes of a fixedly predefined two-dimensional or three-dimensional coordinate system. By way of example, the aforementioned coordinate system is the coordinate system of the object stage.

As mentioned above, in yet a further embodiment of the method according to the system described herein, provision is made for the predefinable region of the object, in relation to the marking (i.e. relative to the marking) and thus also in relation to the beam (i.e. relative to the beam) of the beam apparatus, to be positioned into a new position relative to the marking (and thus also relative to the beam of the beam apparatus) using the processor unit depending on the determined second position of the predefinable region of the object by moving the object stage and/or moving the beam. The new position is for example the desired position after a compensation of a displacement of the position of the predefinable region of the object relative to the marking after a rotation of the object about the first rotation axis (tilt axis) or after a rotation of the capture device about the second rotation axis (i.e. after a change of perspective).

A description is given below of an embodiment of the method according to the system described herein in which the second distance and the further second distance are determined using two image representations both of the predefinable region of the object and of the marking. In this regard, in this embodiment of the method according to the system described herein, provision is additionally or alternatively made for, before rotating the object and/or before rotating the capture device, generating a first image representation both of the predefinable region of the object and of the marking using the beam of the beam apparatus. For this purpose, the beam of the beam apparatus is guided along an optical axis of the beam apparatus to the object and to the marking. By way of example, the beam of the beam apparatus is scanned over the predefinable region of the object and over the marking using a scanning device. Provision is made, in particular, for the marking to be arranged on the object and/or on the object holder. Furthermore, the second distance between the predefinable region of the object and the second straight line is determined using the first image representation. Moreover, provision is additionally or alternatively made for, after rotating the object and/or after rotating the capture device, generating a second image representation both of the predefinable region of the object and of the marking using the beam of the beam apparatus. For this purpose, too, the beam of the beam apparatus is guided along the optical axis of the beam apparatus to the object and to the marking. By way of example, the beam of the beam apparatus is scanned over the predefinable region of the object and over the marking using the scanning device. Furthermore, the further second distance between the predefinable region of the object and the second straight line is determined using the second image representation. Yet again in addition or as an alternative thereto, provision is made for determining a displacement of a position of the predefinable region of the object in the first image representation with respect to a position of the predefinable region of the object in the second image representation from the difference between the second distance and the further second distance. Furthermore, determining the second position of the predefinable region of the object in relation to the marking is carried out using the determined displacement of the position of the predefinable region of the object in the first image representation with respect to the position of the predefinable region of the object in the second image representation.

In one embodiment of the method according to the system described herein, provision is additionally or alternatively made for generating the first image representation to include detecting interaction particles using at least one detector, where the interaction particles result from an interaction between the beam of the beam apparatus and the object. If the beam is configured as a particle beam, for example, then the interaction particles are in particular backscattered particles, for example backscattered electrons, or secondary particles, for example secondary electrons. The first image representation is displayed on a display unit of the beam apparatus. Provision is additionally or alternatively made for generating the second image representation to include detecting interaction particles using the detector, where the interaction particles result from an interaction between the beam of the beam apparatus and the object. If the beam is configured as a particle beam, for example, then the interaction particles are also configured for example as backscattered particles, in particular as backscattered electrons, or as secondary particles, in particular as secondary electrons. The second image representation, too, is displayed on the display unit of the beam apparatus.

In a further embodiment of the method according to the system described herein, provision is additionally or alternatively made for the first image representation to be generated when the object stage is situated in a reference position. The reference position can be any position which is suitable as reference position. Further method steps of the method according to the system described herein are carried out proceeding from the reference position. In particular, provision is additionally or alternatively made for the object stage firstly to be rotated about the first rotation axis into the reference position. The first image representation is generated when the object stage is situated in the reference position. In addition or as an alternative thereto, provision is made for rotating the object to be carried out by rotating the object stage about the first rotation axis and by the first rotation angle when the object stage is situated in the reference position. After rotating the object, generating the second image representation both of the predefinable region of the object and of the marking using the beam of the beam apparatus is provided. Yet again in addition or as an alternative thereto, provision is made for the object stage firstly to be rotated about the first rotation axis into the reference position. Afterward, the object is rotated by rotating the object stage about the first rotation axis and by the first rotation angle. After rotating the object, generating the second image representation both of the predefinable region of the object and of the marking using the beam of the beam apparatus is provided.

In a further embodiment of the method according to the system described herein, the reference position is configured as a zero position. The zero position is distinguished by the fact that the object stage is not rotated about the first rotation axis. In the zero position, the first rotation angle is 0°. In this embodiment of the method according to the system described herein, provision is made, for example, for the first image representation both of the predefinable region and of the marking to be generated when the object stage is not rotated about the first rotation axis and the object stage is thus situated in the zero position. In addition or as an alternative thereto, provision is made for the object stage firstly to be rotated about the first rotation axis into the zero position, in which the object stage is not rotated in relation to the first rotation axis. The first image representation both of the predefinable region and of the marking is generated when the object stage is situated in the zero position. In addition or as an alternative thereto, provision is made for rotating the object to be carried out by rotating the object stage about the first rotation axis and by the first rotation angle when the object stage is situated in the zero position. After rotating the object stage and thus the object, the second image representation both of the predefinable region of the object and of the marking is generated using the beam of the beam apparatus. Yet again in addition or as an alternative thereto, provision is made for the object stage and thus the object to be rotated about the first rotation axis into the zero position. Afterward, the object is rotated by rotating the object stage about the first rotation axis and by the first rotation angle. After rotating the object stage and thus the object, the second image representation both of the predefinable region of the object and of the marking is generated using the beam of the beam apparatus.

In yet a further embodiment of the method according to the system described herein, provision is additionally or alternatively made for determining the second distance to be carried out by manual measurement using the first image representation. In addition or as an alternative thereto, determining the second distance is carried out by automatic measurement using the first image representation and the processor unit using an image recognition method.

In yet another embodiment of the method according to the system described herein, provision is additionally or alternatively made for determining the further second distance to be carried out by manual measurement using the second image representation. In addition or as an alternative thereto, determining the further second distance is carried out by automatic measurement using the second image representation and the processor unit using an image recognition method.

In one embodiment of the method according to the system described herein, provision is additionally or alternatively made for determining the displacement of the position of the predefinable region of the object in the first image representation with respect to the position of the predefinable region of the object in the second image representation, determining the second distance, determining the further second distance and/or determining the second position of the predefinable region of the object to be carried out using the processor unit.

A description is given below of one embodiment of the method according to the system described herein in which three image representations both of the predefinable region of the object and of the marking are used. In this regard, in this embodiment of the method according to the system described herein, provision is made for, before rotating the object and/or before rotating the capture device, generating a first image representation both of the predefinable region of the object and of the marking using the beam of the beam apparatus. For this purpose, the beam is guided along an optical axis of the beam apparatus to the predefinable region of the object and to the marking. In particular, the beam of the beam apparatus is scanned over the predefinable region of the object and/or the marking using the scanning device. The marking is arranged for example on the object and/or on the object holder. Furthermore, provision is made for rotating the object to be carried out by rotating the object stage about the first rotation axis of the object stage and by the first rotation angle in a first rotation direction. Consequently, the object is firstly rotated in the first rotation direction. After the aforementioned rotating of the object in the first rotation direction, a second image representation both of the predefinable region of the object and of the marking is generated using the beam of the beam apparatus, where here, too, the beam is guided along the optical axis of the beam apparatus to the predefinable region of the object and to the marking. In particular, the beam of the beam apparatus is scanned over the predefinable region of the object and/or the marking using the scanning device. Furthermore, rotating the object is carried out by rotating the object stage about the first rotation axis of the object stage and by a third rotation angle in a second rotation direction. Consequently, the object is rotated in the second rotation direction. After rotating the object, a third image representation both of the predefinable region of the object and of the marking is generated using the beam of the beam apparatus, where here, too, the beam is guided along the optical axis of the beam apparatus to the predefinable region of the object and to the marking. In particular, the beam of the beam apparatus is scanned over the predefinable region of the object and/or the marking using the scanning device. Furthermore, provision is made for determining a first displacement of a position of the predefinable region of the object in the first image representation with respect to the position of the predefinable region of the object in the second image representation. Moreover, a second displacement of the position of the predefinable region of the object in the first image representation with respect to the position of the predefinable region of the object in the third image representation is determined. Furthermore, in this embodiment of the method according to the system described herein, provision is made for determining the further second distance to be carried out using the determined and abovementioned first displacement, the determined and abovementioned second displacement, the first rotation angle and/or the third rotation angle.

In a further embodiment of the method according to the system described herein which provides for generating three image representations, provision is additionally or alternatively made for generating the first image representation to include detecting interaction particles using at least one detector, where the interaction particles result from an interaction between the beam of the beam apparatus and the object. If the beam is configured as a particle beam, for example, then the interaction particles are configured for example as backscattered particles, in particular as backscattered electrons, or as secondary particles, in particular as secondary electrons. The first image representation is displayed for example on a display unit of the beam apparatus. In addition or as an alternative thereto, provision is made for generating the second image representation to include detecting the interaction particles using the detector, where the interaction particles result from the interaction between the beam of the beam apparatus and the object. If the beam is configured as a particle beam, for example, then here, too, the interaction particles are configured for example as backscattered particles, in particular as backscattered electrons, or as secondary particles, in particular as secondary electrons. By way of example, the second image representation is displayed on the display unit of the beam apparatus. Yet again in addition or as an alternative thereto, provision is made for generating the third image representation to include detecting the interaction particles using the detector, where the interaction particles result from the interaction between the beam of the beam apparatus and the object. If the beam is configured as a particle beam, for example, then here, too, the interaction particles are configured for example as backscattered particles, in particular as backscattered electrons, or as secondary particles, in particular as secondary electrons. By way of example, the third image representation is displayed on the display unit of the beam apparatus.

In one embodiment of the method according to the system described herein in which three image representations are generated, provision is additionally or alternatively made for the first image representation to be generated when the object stage is situated in a reference position. The reference position can be any position which is suitable as reference position. Further method steps of the method according to the system described herein are carried out proceeding from the reference position. In addition or as an alternative thereto, provision is made for the object stage firstly to be rotated about the first rotation axis into the reference position. Afterward, the first image representation both of the predefinable region and of the marking is generated. Yet again in addition or as an alternative thereto, provision is made for rotating the object to be carried out by rotating the object stage by the first rotation angle in the first rotation direction proceeding from the reference position of the object stage. Afterward, the second image representation both of the predefinable region and of the marking is generated. Furthermore, provision is additionally or alternatively made for rotating the object to be carried out by rotating the object stage by the predefinable third rotation angle in the second rotation direction proceeding from the reference position of the object stage. Afterward, the third image representation both of the predefinable region and of the marking is generated.

In a further embodiment of the method according to the system described herein in which three image representations are generated, the reference position is configured as a zero position. The zero position is distinguished by the fact that the object stage is not rotated about the first rotation axis. The first rotation angle is 0° in the zero position. In this embodiment of the method according to the system described herein, provision is made, for example, for the first image representation both of the predefinable region and of the marking to be generated when the object stage and thus the object are not rotated in relation to the first rotation axis and the object stage is situated in a zero position. In addition or as an alternative thereto, provision is made for the object stage and thus the object firstly to be rotated about the first rotation axis into the zero position, in which the object stage is not rotated in relation to the first rotation axis. When the object stage is situated in the zero position, the first image representation is generated. Yet again in addition or as an alternative thereto, provision is made for rotating the object to be carried out by rotating the object stage by the predefinable first rotation angle in the first rotation direction proceeding from the zero position of the object stage. Afterward, the second image representation both of the predefinable region and of the marking is generated. Furthermore, in addition or as an alternative thereto, provision is made for rotating the object to be carried out by rotating the object stage by the predefinable third rotation angle in the second rotation direction proceeding from the zero position of the object stage. Afterward, the third image representation both of the predefinable region and of the marking is generated.

In a further embodiment of the method according to the system described herein in which three image representations are generated, provision is additionally or alternatively made for a rotation direction which is opposite to the second rotation direction to be used as the first rotation direction. By way of example, the first rotation direction proceeding from the reference position of the object stage is a left rotation direction (in particular a rotation direction in the counterclockwise direction). By contrast, the second rotation direction proceeding from the reference position of the object stage is for example a right rotation direction (in particular a rotation direction in the clockwise direction). In addition or as an alternative thereto, provision is made for a rotation angle whose absolute value corresponds to that of the third rotation angle and which therefore differs from the third rotation angle only in terms of the sign is used as the first rotation angle.

In yet another embodiment of the method according to the system described herein in which three image representations are generated, provision is additionally or alternatively made for determining the first displacement of the position of the predefinable region of the object in the first image representation with respect to the position of the predefinable region of the object in the second image representation to be carried out by manual measurement using the first image representation and the second image representation. In addition or as an alternative thereto, provision is made for determining the first displacement of the position of the predefinable region of the object in the first image representation with respect to the position of the predefinable region of the object in the second image representation to be carried out by automatic measurement using the first image representation and the second image representation using the processor unit. Yet again in addition or as an alternative thereto, provision is made for determining the second displacement of the position of the predefinable region of the object in the first image representation with respect to the position of the predefinable region of the object in the third image representation to the carried out by manual measurement using the first image representation and the third image representation. Furthermore, provision is additionally or alternatively made for determining the second displacement of the position of the predefinable region of the object in the first image representation with respect to the position of the predefinable region of the object in the third image representation to be carried out by automatic measurement using the first image representation and the third image representation using the processor unit.

In one embodiment of the method according to the system described herein in which three image representations are generated, provision is additionally or alternatively made for determining the second distance to be carried out by manual measurement using the first image representation. In addition or as an alternative thereto, determining the second distance is carried out by automatic measurement using the first image representation and the processor unit using an image recognition method. In yet another embodiment of the method according to the system described herein, provision is additionally or alternatively made for determining the further second distance to be carried out by manual measurement using the first image representation, the second image representation and the third image representation. In addition or as an alternative thereto, determining the further second distance is carried out by automatic measurement using the first image representation, the second image representation, the third image representation and the processor unit using an image recognition method.

In one embodiment of the method according to the system described herein, provision is additionally or alternatively made for determining the first displacement of the position of the predefinable region of the object in the first image representation with respect to the position of the predefinable region of the object in the second image representation, determining the second displacement of the position of the predefinable region of the object in the first image representation with respect to the position of the predefinable region of the object in the third image representation, determining the second distance, determining the further second distance and/or determining the second position of the predefinable region of the object to be carried out using the processor unit.

Considerations have revealed that, in one embodiment of the method according to the system described herein, the displacement between the position actually occupied by the predefinable region of the object relative to the marking and the desired position of the predefinable region of the object for a specific first rotation angle can be calculated as follows:

$$\Delta(\beta) = A \cdot \sin(\beta) - B \cdot (1 - \cos(\beta)) \tag{1}$$

where $\Delta$ is the aforementioned displacement between the position actually occupied by the predefinable region of the object relative to the marking and the desired position of the predefinable region of the object as a function of the first rotation angle $\beta$, A is a proportion of the abovementioned displacement in a first direction (for example a vertical direction), and B is a proportion of the abovementioned displacement in a second direction (for example a horizontal direction). In particular, the first direction and the second direction are oriented perpendicular to one another.

Owing to the progression of the sine curve around the zero point, the first term $$A \cdot \sin(\beta) \tag{2}$$

changes sign upon a transition from positive first rotation angles to negative first rotation angles (or vice versa). This is different for the second term $$B \cdot (1 - \cos(\beta)). \tag{3}$$

Owing to the progression of the cosine curve around the zero point, the second term does not change sign upon a transition from positive first rotation angles to negative first rotation angles (or vice versa).

The displacement $\Delta(\beta)$ and the displacement $\Delta(-\beta)$ can be determined using the method according to the system described herein. With the aid of equation [1], the proportion A of the displacement in the first direction can now be determined, namely by:

$$\Delta(\beta) - \Delta(-\beta) = \tag{4}$$
$$(A \cdot \sin(\beta) - B \cdot (1 - \cos(\beta))) - (A \cdot \sin(-\beta) - (B \cdot (1 - \cos(-\beta))))$$

$$\Delta(\beta) - \Delta(-\beta) = 2 \cdot A \cdot \sin(\beta) \tag{5}$$

$$A = \frac{\Delta(\beta) - \Delta(-\beta)}{2 \cdot \sin(\beta)} \tag{6}$$

By virtue of the proportion A of the displacement in the first direction now being known, the proportion B of the displacement in the second direction can now be calculated, specifically from equation [1] solved with respect to the proportion B of the displacement in the second direction:

$$B = -\frac{\Delta(\beta) - A \cdot \sin(\beta)}{1 - \cos(\beta)} \tag{7}$$

The first proportion A and the second proportion B are thus determinable. Accordingly, it is possible to calculate the displacement as a function of any arbitrary first rotation angle ß using equation [1].

In a further embodiment of the method according to the system described herein, provision is additionally or alternatively made for the beam apparatus to provide a plurality of beams. In this regard, provision is made, in particular, for the abovementioned beam to be used as a first beam. Furthermore, the beam apparatus provides a second beam. In particular, provision is made for the object to be imaged, processed and/or analyzed after determining the second position of the predefinable region of the object and/or after positioning the object into a desired position using the second beam.

In yet another embodiment of the method according to the system described herein, provision is additionally or alternatively made for a light microscope, a laser beam apparatus and/or a particle beam apparatus to be used as the beam apparatus. In particular, an electron beam apparatus and/or an ion beam apparatus are/is used.

As mentioned above, in yet another embodiment of the method according to the system described herein, provision is additionally or alternatively made for an eye of a user and/or a camera unit of the beam apparatus to be used as the capture device.

The system described herein also relates to a computer program product including a program code which is loadable or loaded into a processor unit of a beam apparatus, where the program code, when executed in the processor unit, controls the beam apparatus in such a way that a method having at least one of the aforementioned or following features or having a combination of at least two of the aforementioned or following features is carried out. By way of example, provision is made for the beam apparatus to be configured as a particle beam apparatus, in particular as an electron beam apparatus and/or an ion beam apparatus. In addition or as an alternative thereto, provision is made for the beam apparatus to be configured as a light microscope and/or as a laser beam apparatus.

The system described herein furthermore relates to a beam apparatus for processing, imaging and/or analyzing an object. The beam apparatus according to the system described herein has at least one beam generator for generating a beam and at least one objective lens for focusing the beam onto the object. Moreover, the beam apparatus has a movable object stage for arranging the object. Furthermore, an object holder arranged on the object stage is provided, for example. The beam apparatus according to the system described herein furthermore has at least one display device for displaying an image of the object and/or an analysis regarding the object. In addition or as an alternative thereto, the beam apparatus according to the system described herein is provided with at least one capture device for imaging the object. By way of example, the capture device is an eye of a user and/or a camera unit of the beam apparatus. The beam apparatus according to the system described herein is also provided with at least one control unit that includes a processor unit in which a computer program product having at least one of the aforementioned or following features or having a combination of at least two of the aforementioned or following features is loaded.

In a further embodiment of the beam apparatus according to the system described herein, the beam apparatus is configured as a particle beam apparatus. The beam generator is configured as a particle beam generator for generating a particle beam with charged particles. The charged particles are electrons or ions, for example. Additionally or alternatively, in this embodiment of the beam apparatus according to the system described herein, provision is made for the beam apparatus to have a scanning device for scanning the particle beam over the object. Furthermore, in this embodiment, the beam apparatus is provided with at least one detector for detecting interaction particles, where the interaction particles result from an interaction between the particle beam and the object. By way of example, the interaction particles are secondary particles (in particular secondary electrons) or backscattered particles (in particular backscattered electrons).

In a further embodiment of the beam apparatus according to the system described herein, provision is additionally or alternatively made for the beam generator to be configured as a first beam generator and for the beam to be configured as a first beam. Furthermore, the objective lens is configured as a first objective lens for focusing the first beam onto the object. Moreover, the beam apparatus according to the system described herein has at least one second beam generator for generating a second beam. Furthermore, the beam apparatus according to the system described herein has at least one second objective lens for focusing the second beam onto the object. If the beam apparatus is configured as a particle beam apparatus, for example, then in this further embodiment, provision is made for the particle beam generator to be configured as a first particle beam generator and for the particle beam to be configured as a first particle beam with first charged particles. Furthermore, the objective lens is configured as a first objective lens for focusing the first particle beam onto the object. Moreover, the particle beam apparatus has at least one second beam generator for generating a second particle beam with second charged particles. The second charged particles are electrons or ions, for example. In a further embodiment, provision is made for the beam generator to be configured as a first particle beam generator and for the particle beam to be configured as a first particle beam with first charged particles. Furthermore, the objective lens is configured as a first objective lens for focusing the first particle beam onto the object. Moreover, the beam apparatus has at least one second beam generator for generating a second beam. By way of example, the second beam generator is a light beam generator, in particular a laser beam generator. In this respect, the second beam is a light beam, in particular a laser beam. In a yet further embodiment, provision is alternatively made for the beam generator to be configured as a first beam generator and for the beam to be configured as a first beam. Furthermore, the objective lens is configured as a first objective lens for focusing the first beam onto the object. By way of example, the first beam generator is a light beam generator, in particular a laser beam generator. In this respect, the first beam is for example a light beam, in particular a laser beam. Moreover, the beam apparatus has at least one second beam generator for generating a second particle beam with second charged particles. The second charged particles are electrons or ions, in particular.

In yet another embodiment of the beam apparatus according to the system described herein, provision is made for the beam apparatus to be configured as a laser beam apparatus, as a light microscope, as an electron beam apparatus and/or as an ion beam apparatus.

BRIEF DESCRIPTION OF THE DRAWINGS

Further suitable or practical embodiments and advantages of the system described herein are described below in association with the drawings, in which:

FIG. 3 shows a third embodiment of a particle beam apparatus;

FIG. 15 is a schematic illustration of a procedure of a fourth embodiment of a method for determining a position of an object; and FIG. 16 is a schematic illustration of a procedure of a fifth embodiment of a method for determining a position of an object.

DETAILED DESCRIPTION OF VARIOUS EMBODIMENTS

The system described herein will now be explained in more detail with particle beam apparatuses in the form of an SEM and in the form of a combination apparatus having an electron beam column and an ion beam column. Express reference is made to the fact that the invention can be used in any particle beam apparatus, in particular in any electron beam apparatus and/or any ion beam apparatus.

Figure 1:
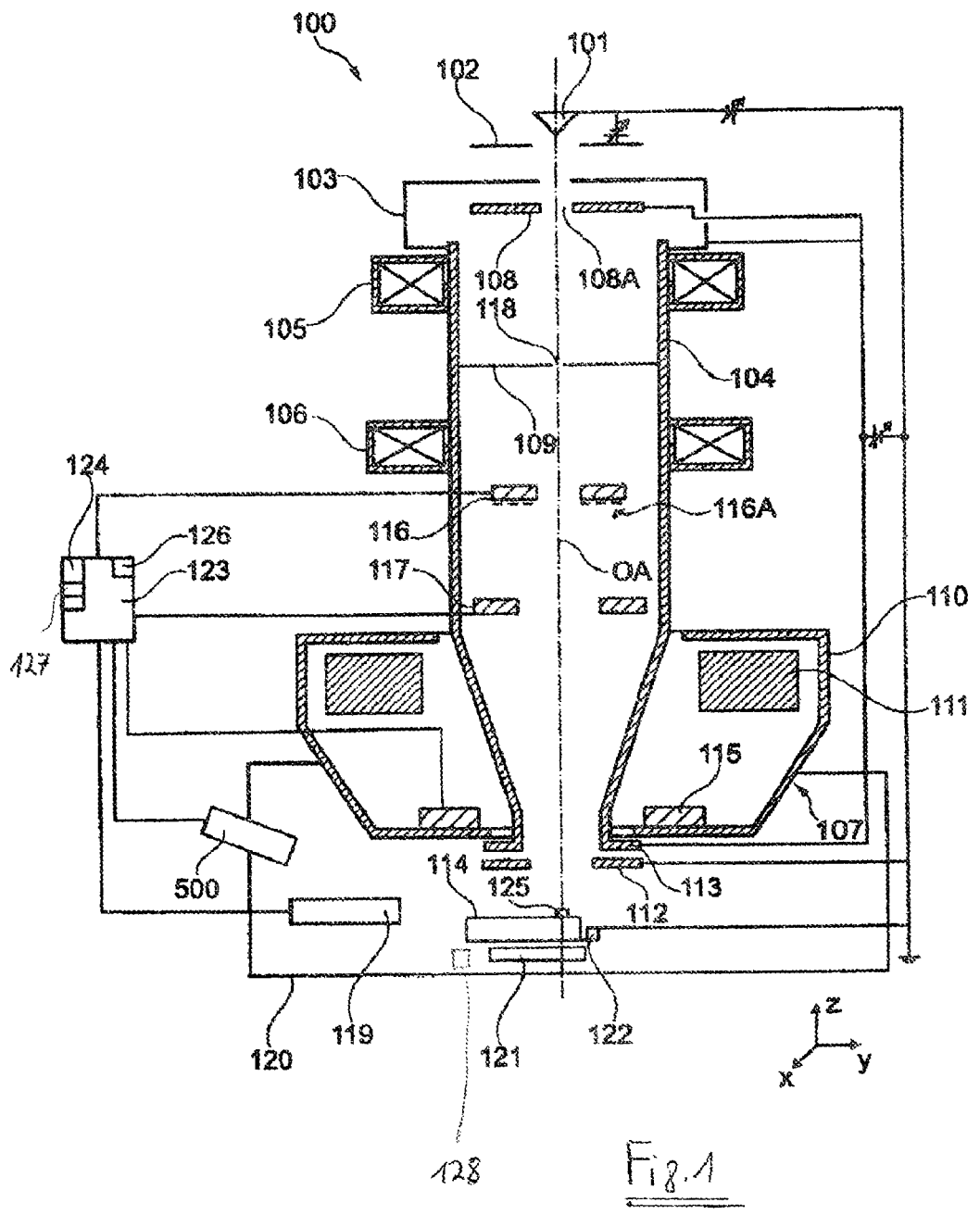
FIG. 1 shows a first embodiment of a particle beam apparatus.

FIG. 1 shows a schematic illustration of an SEM 100. The SEM 100 has a first beam generator in the form of an electron source 101 configured as a cathode. Furthermore, the SEM 100 is provided with an extraction electrode 102 and with an anode 103, which is placed onto one end of a beam guiding tube 104 of the SEM 100. For example, the electron source 101 is configured as a thermal field emitter. However, the invention is not restricted to such an electron source 101. Rather, any electron source can be used.

Electrons emerging from the electron source 101 form a primary electron beam. The electrons are accelerated to anode potential owing to a potential difference between the electron source 101 and the anode 103. In the embodiment shown in FIG. 1, the anode potential is 100 V to 35 KV, for example 5 KV to 15 KV, in particular 8 kV, relative to a ground potential of a housing of a sample chamber 120. However, alternatively the anode potential could also be at ground potential.

Two condenser lenses, namely a first condenser lens 105 and a second condenser lens 106, are arranged on the beam guiding tube 104. In FIG. 1, proceeding from the electron source 101 as viewed in the direction of a first objective lens 107, the first condenser lens 105 is arranged first, followed by the second condenser lens 106. Reference is explicitly made to the fact that further embodiments of the SEM 100 can have only a single condenser lens. A first aperture unit 108 is arranged between the anode 103 and the first condenser lens 105. Together with the anode 103 and the beam guiding tube 104, the first aperture unit 108 is at a high-voltage potential, namely the potential of the anode 103, or connected to ground. The first aperture unit 108 has numerous first apertures 108A, one of which is depicted in FIG. 1. For example, two first apertures 108A are present. Each one of the numerous first apertures 108A has a different aperture diameter. Using an adjusting mechanism (not illustrated), it is possible to set a desired first aperture 108A onto an optical axis OA of the SEM 100. Reference is explicitly made to the fact that, in further embodiments, the first aperture unit 108 can be provided with only a single aperture 108A. In this embodiment, an adjusting mechanism may not be provided. The first aperture unit 108 is then configured to be stationary. A stationary second aperture unit 109 is arranged between the first condenser lens 105 and the second condenser lens 106. As an alternative thereto, provision is made for the second aperture unit 109 to be configured to be movable.

The first objective lens 107 has pole pieces 110, in which a drilled hole is formed. The beam guiding tube 104 is guided through the drilled hole. A coil 111 is arranged in the pole pieces 110.

An electrostatic retardation device is arranged in a lower region of the beam guiding tube 104. The electrostatic retardation device includes an individual electrode 112 and a tube electrode 113. The tube electrode 113 is arranged at one end of the beam guiding tube 104, the end facing an object 125 that is arranged on an object holder 114.

Together with the beam guiding tube 104, the tube electrode 113 is at the potential of the anode 103, while the individual electrode 112 and the object 125 are at a lower potential in relation to the potential of the anode 103. In the present case, the anode potential is the ground potential of the housing of the sample chamber 120. In this way, the electrons of the primary electron beam can be decelerated to a desired energy which is required for examining the object 125.

The SEM 100 also has a scanning device 115 that may cause the primary electron beam to be deflected and scanned over the object 125. Here, the electrons of the primary electron beam interact with the object 125. The interaction results in interaction particles, which are detected. In particular, electrons are emitted from the surface of the object 125—so-called secondary electrons—or electrons of the primary electron beam are backscattered—so-called backscattered electrons—as interaction particles.

The object 125 and the individual electrode 112 can also be at different potentials and potentials different from ground to make it possible to set the location of the retardation of the primary electron beam in relation to the object 125. For example, if the retardation is carried out quite close to the object 125, imaging aberrations become smaller.

A detector arrangement having a first detector 116 and a second detector 117 is arranged in the beam guiding tube 104 to detect the secondary electrons and/or the backscattered electrons. Here, the first detector 116 is arranged on the source side along the optical axis OA, while the second detector 117 is arranged on the object side along the optical axis OA in the beam guiding tube 104. The first detector 116 and the second detector 117 are arranged offset from one another in the direction of the optical axis OA of the SEM 100. Both the first detector 116 and the second detector 117 have a respective passage opening, through which the primary electron beam can pass. The first detector 116 and the second detector 117 are approximately at the potential of the anode 103 and of the beam guiding tube 104. The optical axis OA of the SEM 100 runs through the respective passage openings.

The second detector 117 serves mainly for detection of secondary electrons. Upon emerging from the object 125, the secondary electrons initially have a low kinetic energy and random directions of movement. Using the strong extraction field emanating from the tube electrode 113, the secondary electrons are accelerated in the direction of the first objective lens 107. The secondary electrons enter the first objective lens 107 approximately in parallel. The beam diameter of the beam of the secondary electrons remains small even in the first objective lens 107. The first objective lens 107 then has a strong effect on the secondary electrons and generates a comparatively short focus of the secondary electrons with sufficiently steep angles with respect to the optical axis OA, with the result that the secondary electrons diverge far apart from one another downstream of the focus and strike the active area of the second detector 117. By contrast, only a small proportion of electrons that are backscattered at the object 125—that is to say backscattered electrons which have a relatively high kinetic energy in comparison with the secondary electrons upon emerging from the object 125—are detected by the second detector 117. The high kinetic energy and the angles of the backscattered electrons with respect to the optical axis OA upon emerging from the object 125 have the effect that a beam waist, which is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 can be additionally configured with an opposing field grid 116A. The opposing field grid 116A is arranged on the side of the first detector 116 directed toward the object 125. With respect to the potential of the beam guiding tube 104, the opposing field grid 116A has a negative potential such that only backscattered electrons with a high energy pass through the opposing field grid 116A to the first detector 116. Additionally or alternatively, the second detector 117 has a further opposing field grid, which is configured analogously to the aforementioned opposing field grid 116A of the first detector 116 and has an analogous function.

The detection signals generated by the first detector 116 and the second detector 117 are used to generate an image or images of the surface of the object 125.

Reference is explicitly made to the fact that the apertures of the first aperture unit 108 and second aperture unit 109, as well as the passage openings of the first detector 116 and of the second detector 117, are illustrated in exaggerated fashion. The passage openings of the first detector 116 and of the second detector 117 have an extent perpendicular to the optical axis OA in the range of 0.5 mm to 5 mm. By way of example, the passage openings are circular and have a diameter in the range of 1 mm to 3 mm perpendicular to the optical axis OA.

The second aperture unit 109 is configured as a pinhole aperture unit in the embodiment illustrated in FIG. 1 and is provided with a second aperture 118 for the passage of the primary electron beam, which has an extent in the range of 5 μm to 500 μm, for example 35 μm. As an alternative thereto, provision is made in a further embodiment for the second aperture unit 109 to be provided with a plurality of apertures, which can be displaced mechanically with respect to the primary electron beam or which can be reached by the primary electron beam by the use of electrical and/or magnetic deflection elements. The second aperture unit 109 is configured as a pressure stage aperture unit, which separates a first region, in which the electron source 101 is arranged and in which an ultra-high vacuum ($10^{-7}$ hPa to $10^{-12}$ hPa) prevails, from a second region, which has a high vacuum ($10^{-3}$ hPa to $10^{-7}$ hPa). The second region is the intermediate pressure region of the beam guiding tube 104, which leads to the sample chamber 120.

The sample chamber 120 is under vacuum. To generate the vacuum, a pump (not depicted) is arranged on the sample chamber 120. In the embodiment depicted in FIG. 1, the sample chamber 120 is operated in a first pressure range or in a second pressure range. The first pressure range includes only pressures of less than or equal to $10^{-3}$ hPa, and the second pressure range includes only pressures of greater than $10^{-3}$ hPa. To ensure the pressure ranges, the sample chamber 120 is vacuum-sealed.

The object holder 114 is arranged on an object stage 122 or forms the object stage 122. The object stage 122 is configured to be movable in three directions arranged perpendicular to one another, namely in an x-direction (first stage axis), in a y-direction (second stage axis), and in a z-direction (third stage axis). Moreover, the object stage 122 can be rotated about two rotation axes arranged perpendicular to one another (stage rotation axes). The invention is not restricted to the aforementioned object stage 122. Rather, the object stage 122 can have further translation axes and rotation axes along which or about which the object stage 122 can move.

The SEM 100 also has a third detector 121, which is arranged in the sample chamber 120. More precisely, the third detector 121 is arranged downstream of the object stage 122, as viewed from the electron source 101 along the optical axis OA. The object stage 122, and hence the object holder 114, can be rotated in such a way that the primary electron beam can radiate through the object 125 arranged on the object holder 114. When the primary electron beam passes through the object 125 to be examined, the electrons of the primary electron beam interact with the material of the object 125 to be examined. The electrons passing through the object 125 to be examined are detected by the third detector 121.

A radiation detector 119 used to detect interaction radiation, for example x-ray radiation and/or cathodoluminescent light, is arranged in the sample chamber 120. The radiation detector 119, the first detector 116 and the second detector 117 are connected to a control unit 123, which has a monitor 124 and a processor unit 127. The third detector 121 is also connected to the control unit 123. This is not illustrated for reasons of clarity. Additionally or alternatively, a further detector in the form of a chamber detector 500, in particular for detecting secondary electrons, can be arranged in the sample chamber 120. The further detector is likewise connected to the control unit 123. The control unit 123 processes detection signals generated by the first detector 116, the second detector 117, the third detector 121, the radiation detector 119, and/or the chamber detector 500 and displays the detection signals in the form of images and/or analyses on the monitor 124.

The control unit 123 furthermore has a database 126, in which data are stored and from which data are read out.

Arranged on the object holder 114 is a first heating and/or cooling device 128, which is used to cool and/or heat the object holder 114 and consequently the object 125 arranged there. For example, the object holder 114 is cooled to a temperature of −140° C. or less than −140° C. using liquid nitrogen or liquid helium. A temperature measuring unit (not depicted) is arranged in the sample chamber 120 for the purpose of determining a temperature of the object 125. For example, the temperature measuring unit is configured as an infrared measuring apparatus or a semiconductor temperature sensor. However, the invention is not restricted to the use of such temperature measuring units. Rather, any temperature measuring unit which is suitable for the invention can be used as temperature measuring unit.

Figure 2:
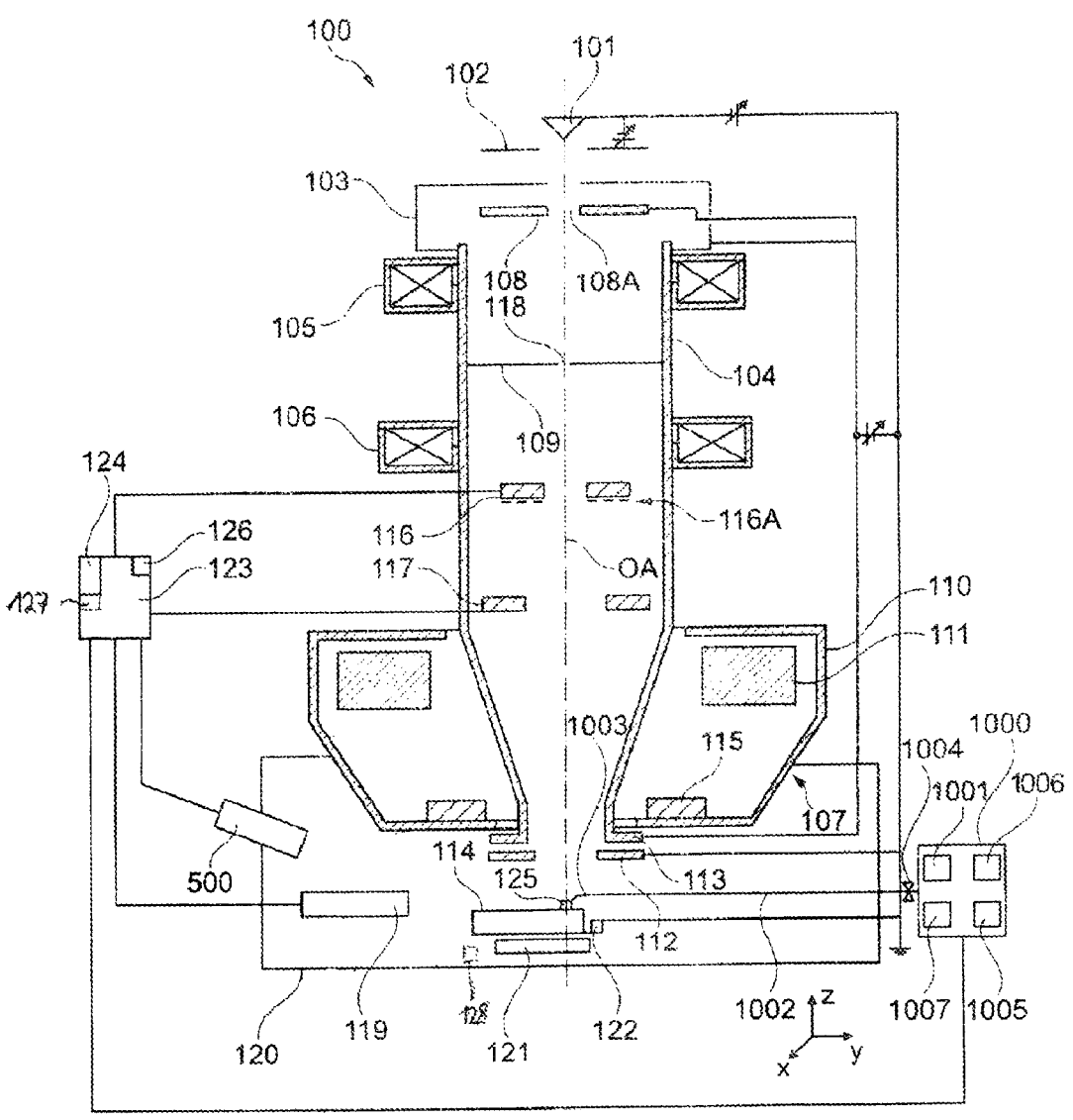
FIG. 2 shows a second embodiment of a particle beam apparatus.

FIG. 2 shows a schematic illustration of a further SEM 100. The embodiment in FIG. 2 is based on the embodiment in FIG. 1. Identical components are provided with identical reference signs. In contrast to the embodiment of the SEM 100 according to FIG. 1, the SEM 100 according to FIG. 2 includes a gas feed device 1000. The gas feed device 1000 serves to feed a gaseous precursor to a specific position on the surface of the object 125 or a unit of the SEM 100. The gas feed device 1000 has a precursor reservoir 1001. By way of example, the precursor is stored as a solid or liquid substance in the precursor reservoir 1001. To bring the precursor into the gaseous state, the precursor is evaporated or sublimated within the precursor reservoir 1001. For example, evaporation or sublimation within the precursor reservoir 1001 can be influenced by controlling the temperature of the precursor reservoir 1001 and/or precursor. As an alternative thereto, the precursor is stored in the precursor reservoir 1001 as a gaseous substance. For example, a precursor including metal is used as precursor in order to deposit a metal or a metal-containing layer on the surface of the object 125. By way of example, a nonconductive material, in particular $SiO_2$, can also be deposited on the surface of the object 125. Furthermore, provision is also made for the precursor to be used for ablating material of the object 125 upon interaction with a particle beam.

The gas feed device 1000 is provided with a feed line 1002. In the direction of the object 125, the feed line 1002 has an acicular and/or capillary device, for example in the form of a hollow tube 1003, which in particular can be brought into the vicinity of the surface of the object 125, for example to a distance of 10 μm to 1 mm from the surface of the object 125. The hollow tube 1003 has a feed opening, the diameter of which is for example in the range of 10 μm to 1000 μm, in particular in the range of 100 μm to 600 μm. The feed line 1002 includes a valve 1004 for regulating the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 125. When the valve 1004 is closed, the inflow of the gaseous precursor onto the surface of the object 125 is stopped.

The gas feed device 1000 is furthermore provided with an adjusting unit 1005, which enables an adjustment of the position of the hollow tube 1003 in all 3 spatial directions—namely an x-direction, a y-direction, and a z-direction—and an adjustment of the orientation of the hollow tube 1003 using a rotation and/or a tilt. The gas feed device 1000 and thus also the adjusting unit 1005 are connected to the control unit 123 of the SEM 100.

In further embodiments, the precursor reservoir 1001 is not arranged directly on the gas feed device 1000. Rather, in the further embodiments, provision is made for the precursor reservoir 1001 to be arranged for example on a wall of a room in which the SEM 100 is situated. As an alternative thereto, provision is made for the precursor reservoir 1001 to be arranged in a first room and for the SEM 100 to be arranged in a second room separate from the first room. Yet again as an alternative thereto, provision is made for the precursor reservoir 1001 to be arranged in a cabinet device.

The gas feed device 1000 includes a temperature measuring unit 1006. For example, a resistance measuring device, a thermocouple, and/or a semiconductor temperature sensor are/is used as temperature measuring unit 1006. However, the invention is not restricted to the use of such temperature measuring units. Rather, any suitable temperature measuring unit which is suitable for the invention can be used as temperature measuring unit. In particular, provision can be made for the temperature measuring unit not to be arranged at the gas feed device 1000, but rather to be arranged for example at a distance from the gas feed device 1000.

The gas feed device 1000 further includes a temperature setting unit 1007. By way of example, the temperature setting unit 1007 is a heating device, in particular a commercially available infrared heating device, a heating wire, and/or a Peltier element. As an alternative thereto, the temperature setting unit 1007 is configured as a heating and/or cooling device having a heating wire, for example. However, the invention is not restricted to the use of such a temperature setting unit 1007. Rather, any suitable temperature setting unit can be used for the invention.

FIG. 3 shows a particle beam apparatus in the form of a combination apparatus 200. The combination apparatus 200 includes two particle beam columns. Firstly, the combination apparatus 200 is provided with the SEM 100, as already depicted in FIG. 1, but without the sample chamber 120. Rather, the SEM 100 is arranged at a sample chamber 201. The sample chamber 201 is under vacuum. To generate the vacuum, a pump (not depicted) is arranged on the sample chamber 201. In the embodiment depicted in FIG. 3, the sample chamber 201 is operated in a first pressure range or in a second pressure range. The first pressure range includes only pressures of less than or equal to $10^{-3}$ hPa, and the second pressure range includes only pressures of greater than $10^{-3}$ hPa. To ensure the first and second pressure ranges, the sample chamber 201 is vacuum-sealed.

The third detector 121 is arranged in the sample chamber 201.

The SEM 100 serves to generate a first particle beam, namely the primary electron beam described above, and has the optical axis mentioned above, which is provided with the reference sign 709 in FIG. 3 and is also referred to as first beam axis below. Secondly, the combination apparatus 200 is provided with an ion beam apparatus 300, which is likewise arranged on the sample chamber 201. The ion beam apparatus 300 likewise has an optical axis, which is provided with the reference sign 710 in FIG. 3 and is also referred to as second beam axis below.

The SEM 100 is arranged vertically in relation to the sample chamber 201. By contrast, the ion beam apparatus 300 is arranged in a manner inclined by an angle of approximately 0° to 90° in relation to the SEM 100. For example, an arrangement of approximately 50° is depicted in FIG. 3. The ion beam apparatus 300 includes a second beam generator in the form of an ion beam generator 301. Ions, which form a second particle beam in the form of an ion beam, are generated by the ion beam generator 301. The ions are accelerated using an extraction electrode 302 at a predefinable potential. The second particle beam then passes through an ion optical unit of the ion beam apparatus 300, the ion optical unit including a condenser lens 303 and a second objective lens 304. The second objective lens 304 ultimately generates an ion probe, which is focused on the object 125 arranged on an object holder 114. The object holder 114 is arranged on an object stage 122.

A settable or selectable aperture unit 306, a first electrode arrangement 307, and a second electrode arrangement 308 are arranged above the second objective lens 304 (i.e. in the direction of the ion beam generator 301), with the first electrode arrangement 307 and the second electrode arrangement 308 being configured as scanning electrodes. The second particle beam is scanned over the surface of the object 125 using the first electrode arrangement 307 and the second electrode arrangement 308, with the first electrode arrangement 307 acting in a first direction and the second electrode arrangement 308 acting in a second direction opposite to the first direction. Hence, the scanning is carried out for example in a first direction. The scanning in a second direction perpendicular to the first direction is effected by further electrodes (not illustrated), which are rotated by 90°, on the first electrode arrangement 307 and on the second electrode arrangement 308.

As explained above, the object holder 114 is arranged on the object stage 122 or forms the object stage 122. In the embodiment shown in FIG. 3, too, the object stage 122 is configured to be movable in three directions arranged perpendicular to one another, namely in an x-direction (first stage axis), in a y-direction (second stage axis), and in a z-direction (third stage axis). Moreover, the object stage 122 can be rotated about two rotation axes arranged perpendicular to one another (stage rotation axes).

The distances illustrated in FIG. 3 between the individual units of the combination apparatus 200 are illustrated in exaggerated fashion in order to better illustrate the individual units of the combination apparatus 200.

A radiation detector 119 used to detect interaction radiation, for example x-ray radiation and/or cathodoluminescent light, is arranged in the sample chamber 201. The radiation detector 119 is connected to a control unit 123 having a monitor 124 and a processor unit 127. Additionally or alternatively, a further detector in the form of a chamber detector 500, in particular for detecting secondary electrons, can be arranged in the sample chamber 201. The chamber detector 500 is likewise connected to the control unit 123.

The control unit 123 processes detection signals generated by the first detector 116, the second detector 117 (not illustrated in FIG. 3), the third detector 121, the radiation detector 119, and/or the chamber detector 500 and displays the detection signals in the form of images and/or analyses on the monitor 124.

The control unit 123 furthermore has a database 126, in which data are stored and from which data are read out.

Arranged on the object holder 114 is a first heating and/or cooling device 128, which is used to cool and/or heat the object holder 114 and consequently the object 125 arranged there. For example, the object holder 114 is cooled to a temperature of −140° C. or less than −140° C. using liquid nitrogen or liquid helium. A temperature measuring unit (not depicted) is arranged in the sample chamber 201 for the purpose of determining a temperature of the object 125. For example, the temperature measuring unit is configured as an infrared measuring apparatus or a semiconductor temperature sensor. However, the invention is not restricted to the use of such temperature measuring units. Rather, any temperature measuring unit which is suitable for the invention can be used as temperature measuring unit.

Figure 4:
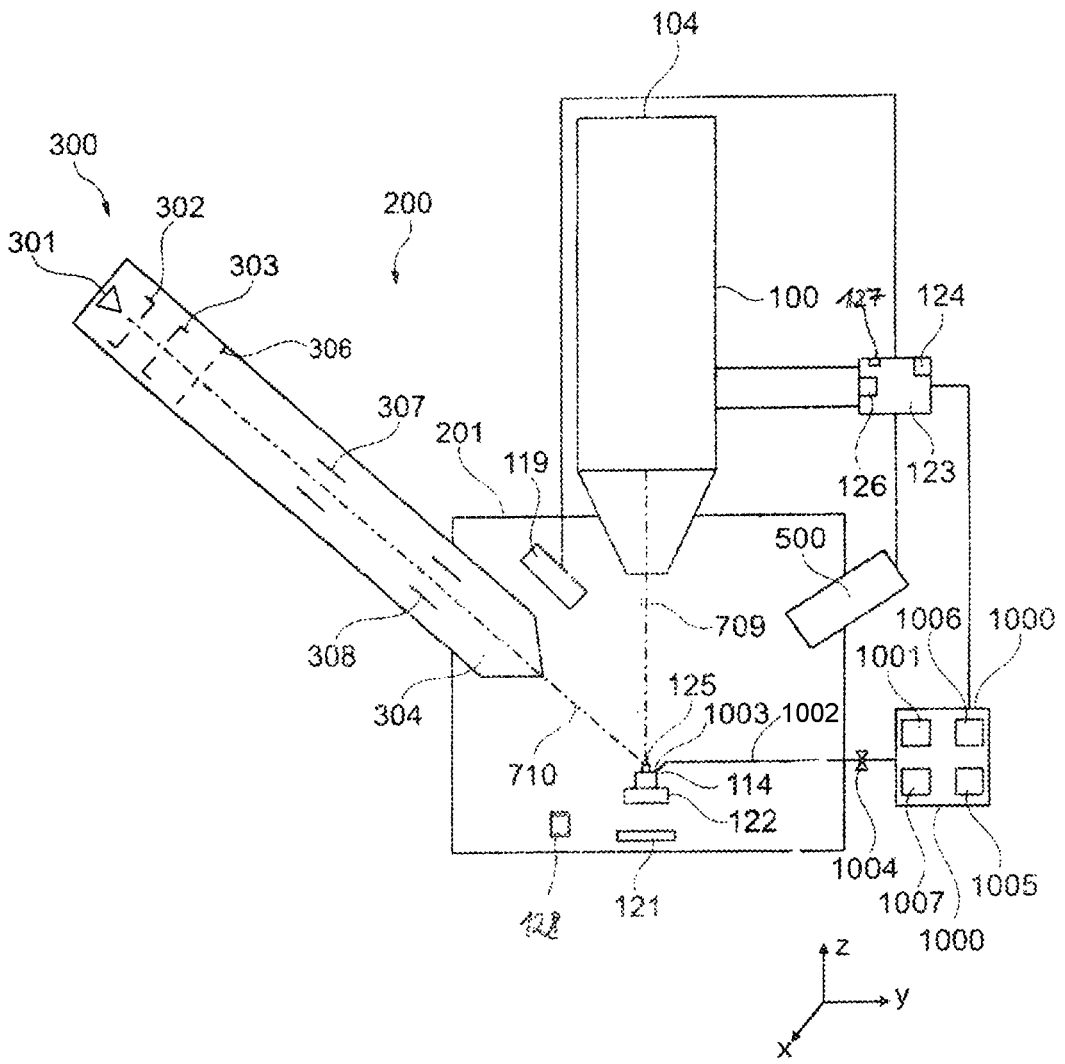
FIG. 4 shows a fourth embodiment of a particle beam apparatus.

FIG. 4 shows a schematic illustration of a further combination apparatus 200. The embodiment in FIG. 4 is based on the embodiment in FIG. 3. Identical components are provided with identical reference signs. In contrast to the embodiment of the combination apparatus 200 according to FIG. 3, the combination apparatus 200 according to FIG. 4 has a gas feed device 1000. The gas feed device 1000 serves to feed a gaseous precursor to a specific position on the surface of the object 125 or a unit of the combination apparatus 200. The gas feed device 1000 has a precursor reservoir 1001. By way of example, the precursor is stored as a solid or liquid substance in the precursor reservoir 1001. To bring the precursor into the gaseous state, the precursor is evaporated or sublimated within the precursor reservoir 1001. For example, evaporating or sublimating within the precursor reservoir 1001 can be influenced by controlling the temperature of the precursor reservoir 1001 and/or the precursor. As an alternative thereto, the precursor is stored in the precursor reservoir 1001 as a gaseous substance. For example, a precursor including metal is used as a precursor in order to deposit a metal or a metal-containing layer on the surface of the object 125. By way of example, a non-conductive material, in particular $SiO_2$, can also be deposited on the surface of the object 125. Furthermore, provision is also made for the precursor to be used for ablating material of the object 125 upon interaction with the particle beam.

The gas feed device 1000 is provided with a feed line 1002. In the direction of the object 125, the feed line 1002 has an acicular and/or capillary device, for example in the form of a hollow tube 1003, which in particular can be brought into the vicinity of the surface of the object 125, for example to a distance of 10 μm to 1 mm from the surface of the object 125. The hollow tube 1003 has a feed opening, the diameter of which is for example in the range of 10 μm to 1000 μm, in particular in the range of 100 μm to 600 μm. The feed line 1002 includes a valve 1004 for regulating the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 125. When the valve 1004 is closed, the inflow of the gaseous precursor onto the surface of the object 125 is stopped.

The gas feed device 1000 is furthermore provided with an adjusting unit 1005, which enables an adjustment of the position of the hollow tube 1003 in all 3 spatial directions—namely an x-direction, a y-direction, and a z-direction—and an adjustment of the orientation of the hollow tube 1003 using a rotation and/or a tilt. The gas feed device 1000 and thus also the adjusting unit 1005 are connected to the control unit 123 of the SEM 100.

In further embodiments, the precursor reservoir 1001 is not arranged directly on the gas feed device 1000. Rather, in the further embodiments, provision is made for the precursor reservoir 1001 to be arranged for example on a wall of a room in which the combination apparatus 200 is situated. As an alternative thereto, provision is made for the precursor reservoir 1001 to be arranged in a first room and for the combination apparatus 200 to be arranged in a second room separate from the first room. Yet again as an alternative thereto, provision is made for the precursor reservoir to be arranged in a cabinet device.

The gas feed device 1000 includes a temperature measuring unit 1006. By way of example, a resistance measuring device, a thermocouple, and/or a semiconductor temperature sensor are/is used as the temperature measuring unit 1006. However, the invention is not restricted to the use of such temperature measuring units. Rather, any temperature measuring unit which is suitable for the invention can be used as temperature measuring unit. In particular, provision can be made for the temperature measuring unit not to be arranged at the gas feed device 1000, but rather to be arranged for example at a distance from the gas feed device 1000.

The gas feed device 1000 further includes a temperature setting unit 1007. By way of example, the temperature setting unit 1007 is a heating device, in particular a commercially available infrared heating device, a heating wire, and/or a Peltier element. As an alternative thereto, the temperature setting unit 1007 is configured as a heating and/or cooling device having a heating wire, for example. However, the invention is not restricted to the use of such a temperature setting unit 1007. Rather, any suitable temperature setting unit can be used for the invention.

Figure 5:
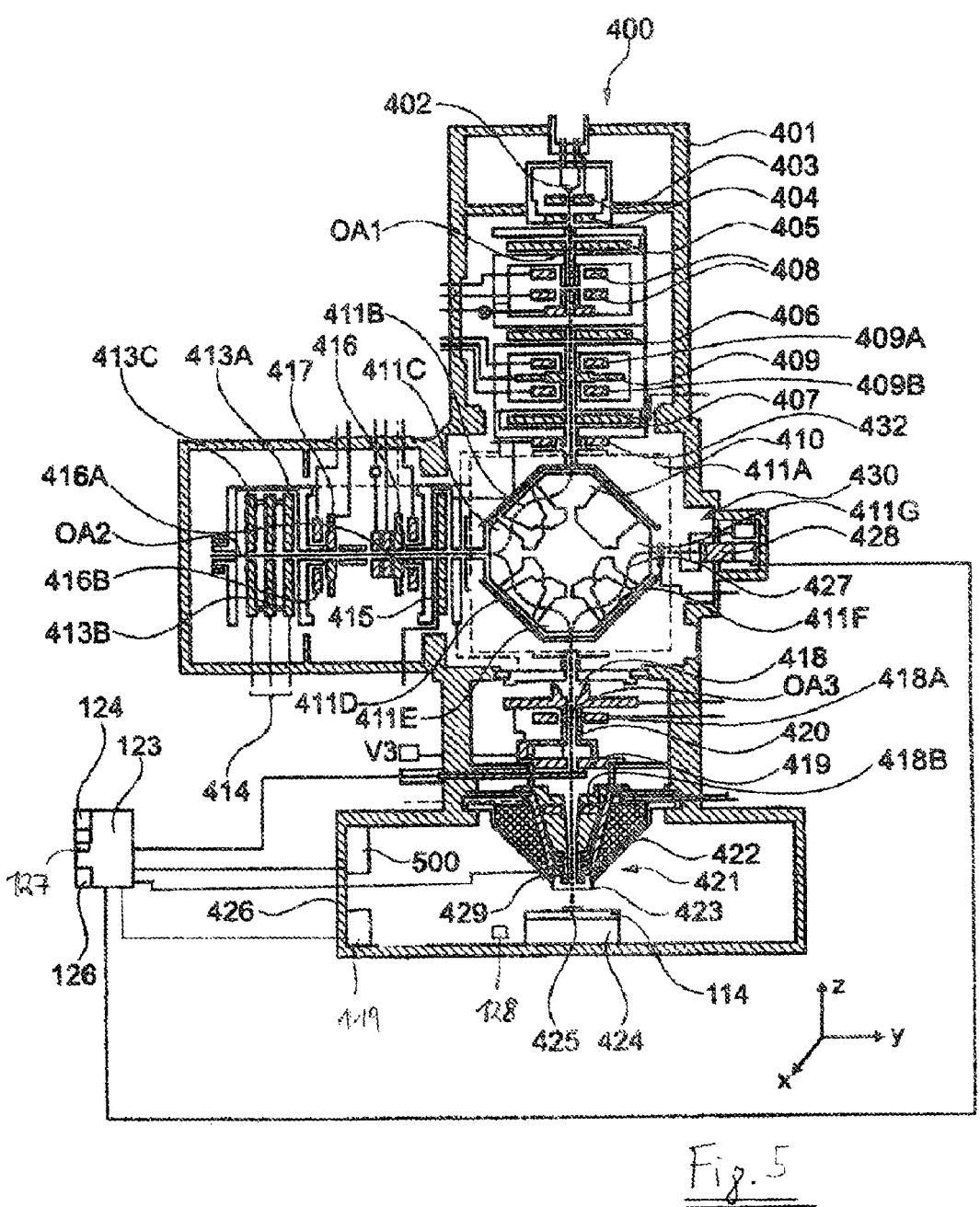
FIG. 5 shows a fifth embodiment of a particle beam apparatus.

FIG. 5 is a schematic illustration of a further embodiment of a particle beam apparatus according to the system described herein. The embodiment of the particle beam apparatus illustrated in FIG. 5 is provided with a reference sign 400 and includes a mirror corrector for correcting chromatic and/or spherical aberrations, for example. The particle beam apparatus 400 includes a particle beam column 401, which is configured as an electron beam column and which substantially corresponds to an electron beam column of a corrected SEM. However, the particle beam apparatus 400 is not restricted to an SEM with a mirror corrector. Rather, the particle beam apparatus can include any type of corrector units.

The particle beam column 401 includes a particle beam generator in the form of an electron source 402 (cathode), an extraction electrode 403, and an anode 404. By way of example, the electron source 402 is configured as a thermal field emitter. Electrons emerging from the electron source 402 are accelerated to the anode 404 owing to a potential difference between the electron source 402 and the anode 404. Accordingly, a particle beam in the form of an electron beam is formed along a first optical axis OA1.

The particle beam is guided along a beam path corresponding to the first optical axis OA1 after the particle beam has emerged from the electron source 402. A first electrostatic lens 405, a second electrostatic lens 406, and a third electrostatic lens 407 are used to guide the particle beam.

Furthermore, the particle beam is set along the beam path using a beam guiding device. The beam guiding device in the embodiment of FIG. 5 includes a source setting unit with two magnetic deflection units 408 arranged along the first optical axis OA1. Moreover, the particle beam apparatus 400 includes electrostatic beam deflection units. A first electrostatic beam deflection unit 409, which is also configured as a quadrupole in a further embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A and the second multi-pole unit 409B are set for the purpose of setting the particle beam with respect to the axis of the third electrostatic lens 407 and the entrance window of a beam deflection device 410. The first electrostatic beam deflection unit 409, the first multi-pole unit 409A, and the second multi-pole unit 409B can interact like a Wien filter. A further magnetic deflection element 432 is arranged at the entrance to the beam deflection device 410.

The beam deflection device 410 is used as a particle beam deflector, which deflects the particle beam in a specific manner. The beam deflection device 410 includes a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and is deflected by the beam deflection device 410 in the direction of a second optical axis OA2. The beam deflection is performed using the first magnetic sector 411A, using the second magnetic sector 411B, and using the third magnetic sector 411C through an angle of 30° to 120°. The second optical axis OA2 is oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the embodiment in FIG. 5, the deflection with respect to the second optical axis OA2 and with respect to the third optical axis OA3 is provided by deflection of the particle beam at an angle of 90°. Hence, the third optical axis OA3 runs coaxially with respect to the first optical axis OA1. However, reference is made to the fact that the particle beam apparatus 400 according to the invention is not restricted to deflection angles of 90°. Rather, any suitable deflection angle can be chosen by the beam deflection device 410, for example 70° or 110°, with the result that the first optical axis OA1 does not run coaxially with respect to the third optical axis OA3. In respect of further details of the beam deflection device 410, reference is made to WO 2002/067286 A2.

After the particle beam has been deflected by the first magnetic sector 411A, the second magnetic sector 411B, and the third magnetic sector 411C, the particle beam is guided along the second optical axis OA2. The particle beam is guided to an electrostatic mirror 414 and travels on a path of the particle beam to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 includes a first mirror electrode 413A, a second mirror electrode 413B, and a third mirror electrode 413C. Electrons of the particle beam which are reflected back at the electrostatic mirror 414 once again travel along the second optical axis OA2 and re-enter the beam deflection device 410. Then, the electrons are deflected to the third optical axis OA3 by the third magnetic sector 411C, the fourth magnetic sector 411D, and the fifth magnetic sector 411E.

The electrons of the particle beam emerge from the beam deflection device 410 and are guided along the third optical axis OA3 to an object 425 that is intended to be examined and is arranged in an object holder 114. On the path to the object 425, the particle beam is guided to a fifth electrostatic lens 418, a beam guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electrical potential of the beam guiding tube 420.

Using the objective lens 421, the particle beam is focused into a focal plane in which the object 425 is arranged. The object holder 114 is arranged on a movable object stage 424 or forms the object stage 424. The movable object stage 424 is arranged in a sample chamber 426 of the particle beam apparatus 400. The object stage 424 is configured to be movable in three directions arranged perpendicular to one another, namely in an x-direction (first stage axis), in a y-direction (second stage axis), and in a z-direction (third stage axis). Moreover, the object stage 424 can be rotated about two rotation axes arranged perpendicular to one another (stage rotation axes).

The sample chamber 426 is under vacuum. To generate the vacuum, a pump (not depicted) is arranged on the sample chamber 426. In the embodiment depicted in FIG. 5, the sample chamber 426 is operated in a first pressure range or in a second pressure range. The first pressure range includes only pressures of less than or equal to $10^{-3}$ hPa, and the second pressure range includes only pressures of greater than $10^{-3}$ hPa. To ensure the first and second pressure ranges, the sample chamber 426 is vacuum-sealed.

The objective lens 421 can be configured as a combination of a magnetic lens 422 and a sixth electrostatic lens 423. The end of the beam guiding tube 420 can furthermore be an electrode of an electrostatic lens. After emerging from the beam guiding tube 420, particles of the particle beam are decelerated to a potential of the object 425. The objective lens 421 is not restricted to a combination of the magnetic lens 422 and the sixth electrostatic lens 423. Rather, the objective lens 421 can assume any suitable form. For example, the objective lens 421 can also be configured as a purely magnetic lens or as a purely electrostatic lens.

The particle beam which is focused on the object 425 interacts with the object 425. Interaction particles are generated. In particular, secondary electrons are emitted from the object 425 or backscattered electrons are backscattered at the object 425. The secondary electrons or the backscattered electrons are accelerated again and guided into the beam guiding tube 420 along the third optical axis OA3. In particular, the trajectories of the secondary electrons and the backscattered electrons travel on the route of the beam path of the particle beam in the opposite direction to the particle beam.

The particle beam apparatus 400 includes a first analysis detector 419, which is arranged between the beam deflection device 410 and the objective lens 421 along the beam path. Secondary electrons traveling in directions oriented at a large angle with respect to the third optical axis OA3 are detected by the first analysis detector 419. Backscattered electrons and secondary electrons which are at a small axial distance with respect to the third optical axis OA3 at the location of the first analysis detector 419—i.e. backscattered electrons and secondary electrons which are at a small distance from the third optical axis OA3 at the location of the first analysis detector 419—enter the beam deflection device 410 and are deflected along a detection beam path 427 to a second analysis detector 428 by the fifth magnetic sector 411E, the sixth magnetic sector 411F, and the seventh magnetic sector 411G. For example, the deflection angle is 90° or 110°.

The first analysis detector 419 generates detection signals which are largely generated by emitted secondary electrons. The detection signals which are generated by the first analysis detector 419 are guided to a control unit 123 and are used to obtain information about the properties of the region of interaction of the focused particle beam with the object 425. In particular, the focused particle beam is scanned over the object 425 using a scanning device 429. Using the detection signals generated by the first analysis detector 419, an image of the scanned region of the object 425 can then be generated and displayed on a display unit. The display unit is, for example, a monitor 124 that is arranged on the control unit 123. The control unit 123 additionally has a processor unit 127.

The second analysis detector 428 is also connected to the control unit 123. Detection signals from the second analysis detector 428 are passed to the control unit 123 and used to generate an image of the scanned region of the object 425 and to display the image on a display unit. The display unit is, for example, the monitor 124 that is arranged on the control unit 123.

Arranged at the sample chamber 426 is a radiation detector 119 used to detect interaction radiation, for example x-ray radiation and/or cathodoluminescent light. The radiation detector 119 is connected to the control unit 123 having the monitor 124. The control unit 123 processes detection signals from the radiation detector 119 and displays the detection signals in the form of images on the monitor 124.

The control unit 123 furthermore has a database 126, in which data are stored and from which data are read out.

Moreover, the particle beam apparatus 400 includes a chamber detector 500 connected to the control unit 123.

Arranged on the object holder 114 is a first heating and/or cooling device 128, which is used to cool and/or heat the object holder 114 and consequently the object 425 arranged there. For example, the object holder 114 is cooled to a temperature of −140° C. or less than −140° C. using liquid nitrogen or liquid helium. A temperature measuring unit (not depicted) is arranged in the sample chamber 426 for the purpose of determining a temperature of the object 425. For example, the temperature measuring unit is configured as an infrared measuring apparatus or a semiconductor temperature sensor. However, the invention is not restricted to the use of such temperature measuring units. Rather, any temperature measuring unit which is suitable for the invention can be used as temperature measuring unit.

Figure 6:
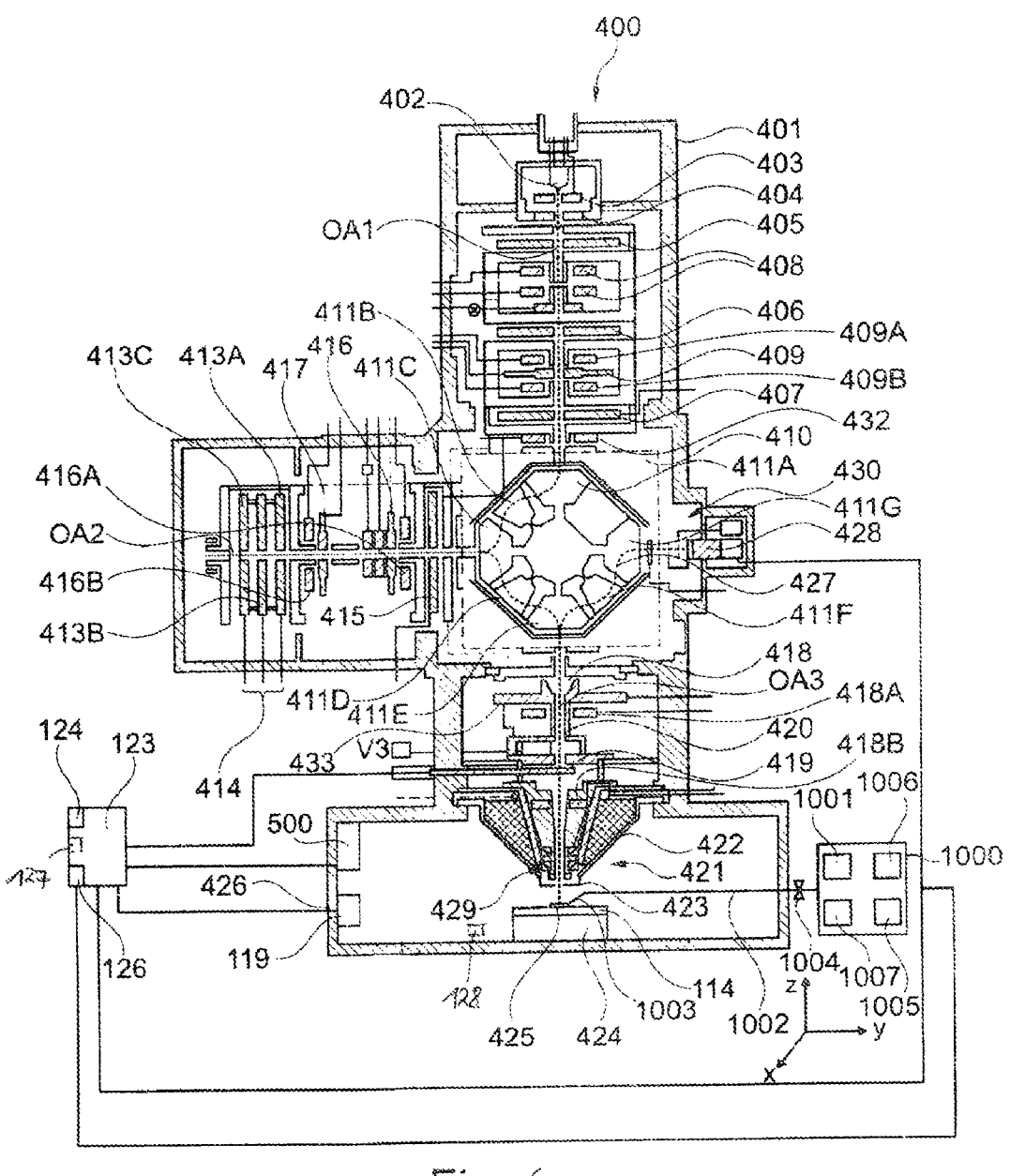
FIG. 6 shows a sixth embodiment of a particle beam apparatus.

FIG. 6 shows a schematic illustration of a further particle beam apparatus 400. The embodiment in FIG. 6 is based on the embodiment in FIG. 5. Identical components are provided with identical reference signs. In contrast to the embodiment of the particle beam apparatus 400 according to FIG. 5, the particle beam apparatus 400 according to FIG. 6 has a gas feed device 1000. The gas feed device 1000 serves to feed a gaseous precursor to a specific position on the surface of the object 425 or a unit of the particle beam apparatus 400. The gas feed device 1000 has a precursor reservoir 1001. By way of example, the precursor is stored as a solid or liquid substance in the precursor reservoir 1001. To bring the precursor into the gaseous state, the precursor is evaporated or sublimated within the precursor reservoir 1001. For example, evaporating or sublimating within the precursor reservoir 1001 can be influenced by controlling the temperature of the precursor reservoir 1001 and/or precursor. As an alternative thereto, the precursor is stored in the precursor reservoir 1001 as a gaseous substance. For example, a precursor including metal is used as precursor in order to deposit a metal or a metal-containing layer on the surface of the object 425. By way of example, a nonconductive material, in particular $SiO_2$, can also be deposited on the surface of the object 425. Furthermore, provision is also made for the precursor to be used for ablating material of the object 425 upon interaction with the particle beam.

The gas feed device 1000 is provided with a feed line 1002. In the direction of the object 425, the feed line 1002 has an acicular and/or capillary device, for example in the form of a hollow tube 1003, which in particular can be brought into the vicinity of the surface of the object 425, for example to a distance of 10 μm to 1 mm from the surface of the object 425. The hollow tube 1003 has a feed opening, the diameter of which is for example in the range of 10 μm to 1000 μm, in particular in the range of 100 μm to 600 μm. The feed line 1002 includes a valve 1004 for regulating the flow rate of gaseous precursor into the feed line 1002. Expressed differently, when the valve 1004 is opened, gaseous precursor from the precursor reservoir 1001 is introduced into the feed line 1002 and guided via the hollow tube 1003 to the surface of the object 425. When the valve 1004 is closed, the inflow of the gaseous precursor onto the surface of the object 425 is stopped.

The gas feed device 1000 is furthermore provided with an adjusting unit 1005, which enables an adjustment of the position of the hollow tube 1003 in all 3 spatial directions— namely an x-direction, a y-direction, and a z-direction—and an adjustment of the orientation of the hollow tube 1003 using a rotation and/or a tilt. The gas feed device 1000 and thus also the adjusting unit 1005 are connected to the control unit 123 of the particle beam apparatus 400.

In further embodiments, the precursor reservoir 1001 is not arranged directly on the gas feed device 1000. Rather, in the further embodiments, provision is made for the precursor reservoir 1001 to be arranged for example on a wall of a room in which the particle beam apparatus 400 is situated. As an alternative thereto, provision is made for the precursor reservoir 1001 to be arranged in a first room and for the particle beam apparatus 400 to be arranged in a second room separate from the first room. Yet again as an alternative thereto, provision is made for the precursor reservoir 1001 to be arranged in a cabinet device.

The gas feed device 1000 includes a temperature measuring unit 1006. By way of example, a resistance measuring device, a thermocouple, and/or a semiconductor temperature sensor are/is used as temperature measuring unit 1006. However, the invention is not restricted to the use of such temperature measuring units. Rather, any temperature measuring unit which is suitable for the invention can be used as temperature measuring unit. In particular, provision can be made for the temperature measuring unit not to be arranged at the gas feed device 1000, but rather to be arranged for example at a distance from the gas feed device 1000.

The gas feed device 1000 further includes a temperature setting unit 1007. By way of example, the temperature setting unit 1007 is a heating device, in particular a commercially available infrared heating device, a heating wire, and/or a Peltier element. As an alternative thereto, the temperature setting unit 1007 is configured as a heating and/or cooling device having a heating wire, for example. However, the invention is not restricted to the use of such a temperature setting unit 1007. Rather, any suitable temperature setting unit can be used for the invention.

Figure 7:
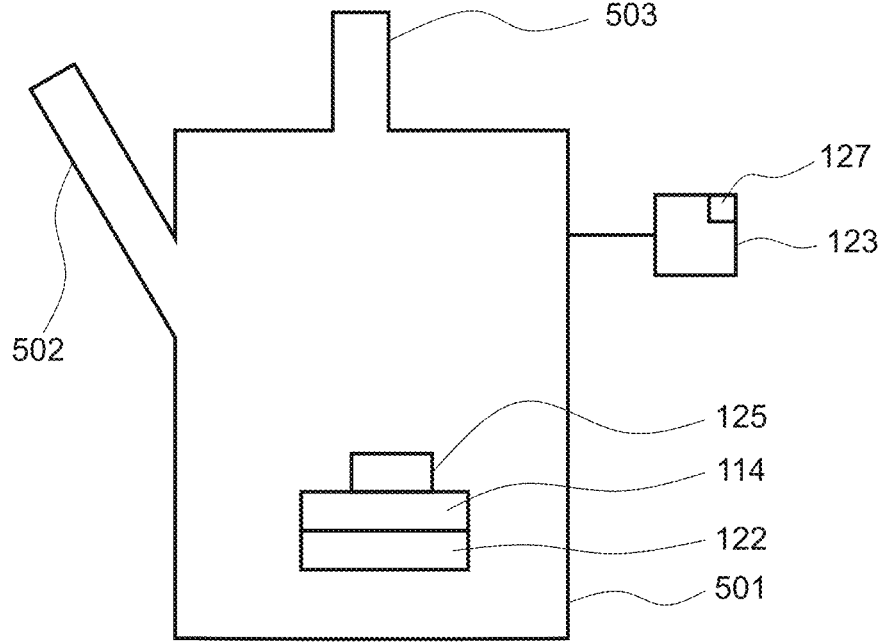
FIG. 7 shows one embodiment of a beam apparatus.

FIG. 7 shows a schematic illustration of a beam apparatus 501, in which an object 125 is arranged on an object holder 114. The object holder 114 is arranged on a movable object stage 122 or forms the movable object stage 122. By way of example, the beam apparatus 501 is configured as a laser beam apparatus and/or as a light microscope. The beam apparatus 501 has a light source 502, for example a laser beam device or a light source for illuminating the object 125. Furthermore, the beam apparatus 501 has a capture device 503 configured for example as a camera unit of the beam apparatus 501 or as an eye of a user of the beam apparatus 501. The capture device 503 is configured to be movable. This is discussed in even greater detail further below.

Figure 8:
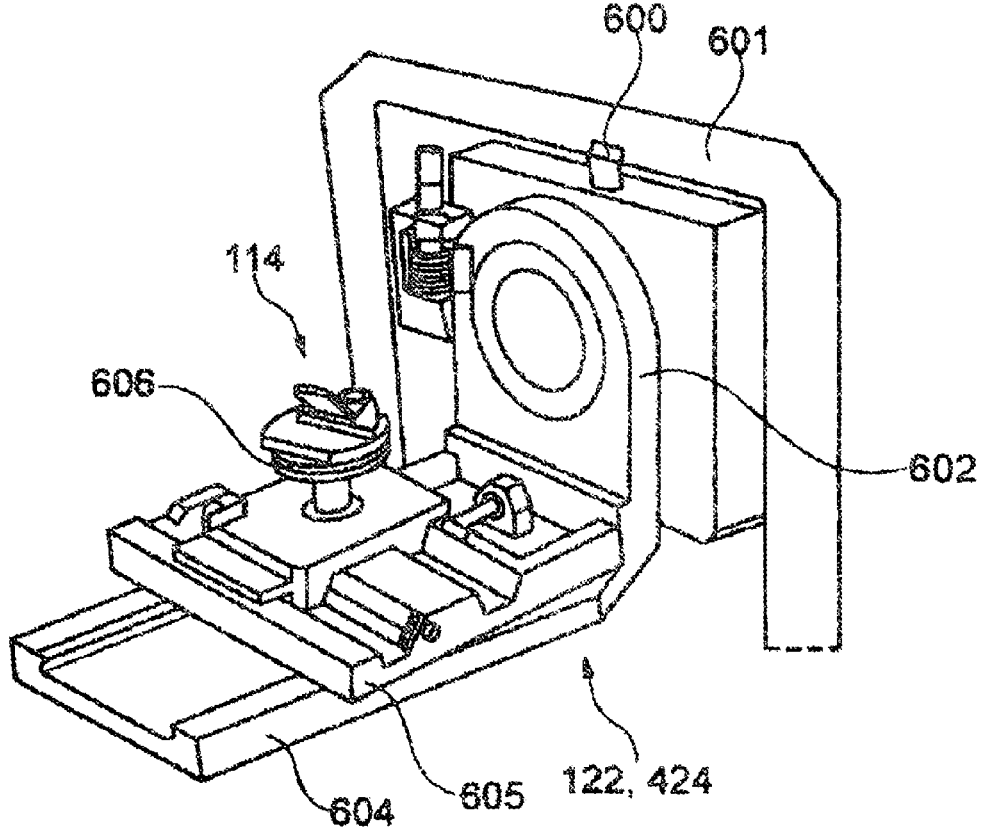
FIG. 8 is a schematic illustration of an object stage.

The object stage 122, 424 of the particle beam apparatuses 100, 200 and 400 explained above and of the beam apparatus 501 are discussed in greater detail below. The object stage 122, 424 is configured as a movable object stage, which is illustrated schematically in FIGS. 8 and 9. It is pointed out that the invention is not restricted to the object stage 122, 424 described here. Rather, the invention can include any movable object stage that is suitable for the invention.

The object holder 114 is arranged on the object stage 122, 424. The object stage 122, 424 has movement elements that ensure a movement of the object stage 122, 424 in such a way that a region of interest on the object can be examined using a particle beam and/or a light beam, for example. The movement elements are illustrated schematically in FIGS. 8 and 9 and are explained below.

The object stage 122, 424 has a first movement element 600, which is arranged, for example, at a housing 601 of the sample chamber 120, 201 or 426, in which the object stage 122, 424 is arranged in turn. The first movement element 600 enables a movement of the object stage 122, 424 along the z-axis (third stage axis). A second movement element 602 is also provided. The second movement element 602 enables a rotation of the object stage 122, 424 about a first stage rotation axis 603, which is also referred to as a tilt axis. The second movement element 602 serves to tilt the object 125, 425 about the first stage rotation axis 603, where the object 125, 425 is arranged on the object holder 114.

In turn, a third movement element 604, which is configured as a guide for a slide and ensures that the object stage 122, 424 is movable in the x-direction (first stage axis), is arranged on the second movement element 602. The aforementioned slide is in turn a further movement element, namely a fourth movement element 605. The fourth movement element 605 is configured in such a way that the object stage 122, 424 is movable in the y-direction (second stage axis). For moving the object stage 122, 424 in the y-direction, the fourth movement element 605 has a guide in which a further slide is guided, the object holder 114 in turn being arranged at the latter.

The object holder 114 is in turn configured with a fifth movement element 606, which enables a rotation of the object holder 114 about a second stage rotation axis 607. The second stage rotation axis 607 is oriented perpendicular to the first stage rotation axis 603.

On account of the above-described arrangement, the object stage 122, 424 of the embodiment discussed here has the following kinematic chain: first movement element 600 (movement along the z-axis)—second movement element 602 (rotation about the first stage rotation axis 603)—third movement element 604 (movement along the x-axis)—fourth movement element 605 (movement along the y-axis)—fifth movement element 606 (rotation about the second stage rotation axis 607).

In a further embodiment (not illustrated), provision is made for further movement elements to be arranged at the object stage 122, 424 such that movements along further translational axes and/or about further rotation axes are made possible.

Figure 9:
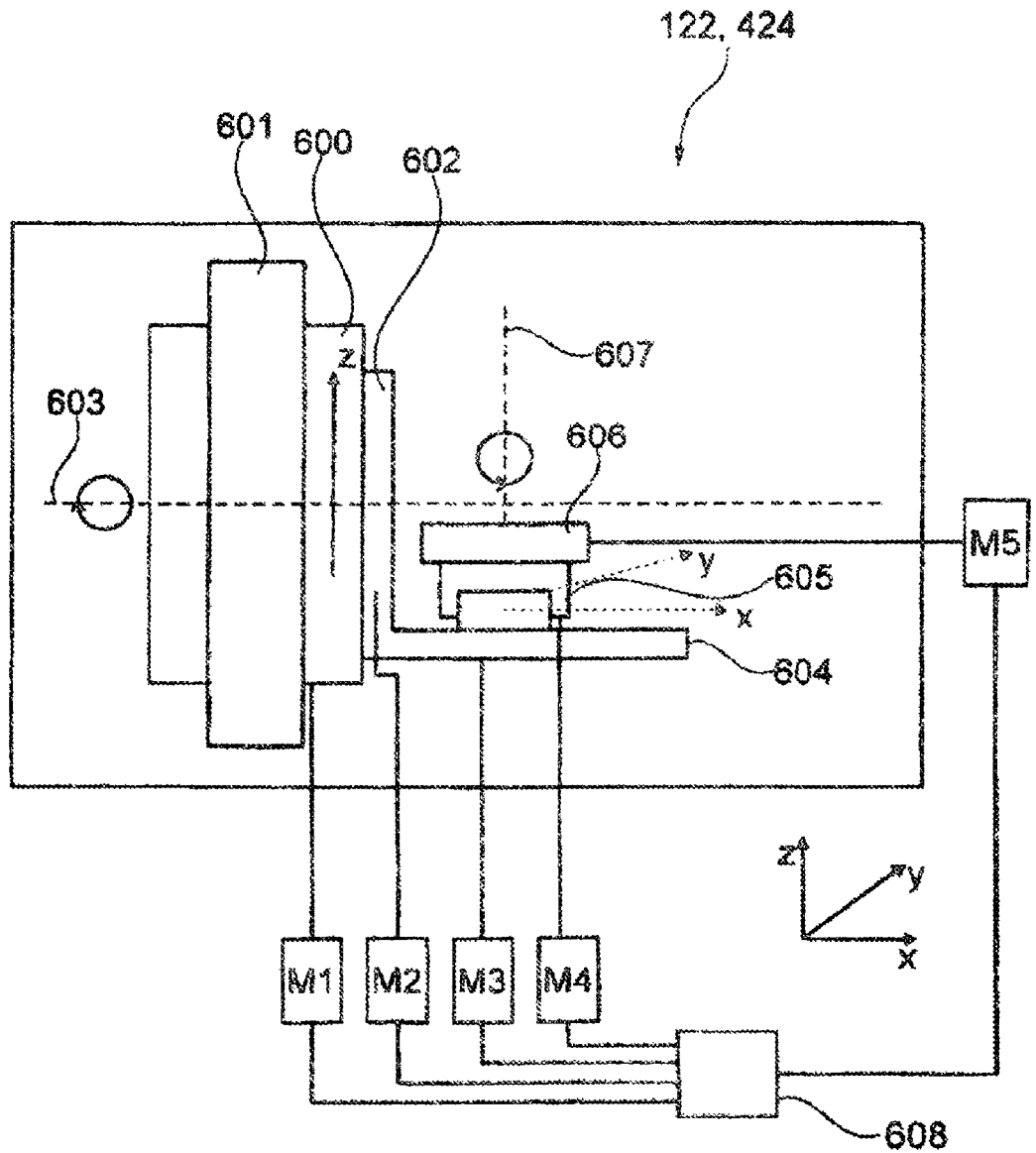
FIG. 9 is a further schematic illustration of an object stage in accordance with FIG. 8.

As is evident from FIG. 9, each of the aforementioned movement elements is connected to a drive unit in the form of a motor M1 to M5. In this regard, the first movement element 600 is connected to a first drive unit M1 and is driven owing to a driving force that is provided by the first drive unit M1. The second movement element 602 is connected to a second drive unit M2, which drives the second movement element 602. The third movement element 604 is connected, in turn, to a third drive unit M3. The third drive unit M3 provides a driving force for driving the third movement element 604. The fourth movement element 605 is connected to a fourth drive unit M4, with the fourth drive unit M4 driving the fourth movement element 605. Furthermore, the fifth movement element 606 is connected to a fifth drive unit M5. The fifth drive unit M5 provides a driving force that drives the fifth movement element 606.

The aforementioned drive units M1 to M5 can be configured as stepper motors, for example, and are controlled by a drive control unit 608 and are each supplied with a supply current by the drive control unit 608 (cf. FIG. 9). It is explicitly pointed out that the invention is not restricted to the movement using stepper motors. Rather, any drive units can be used as drive units, for example brushless motors.

The control unit 123 of the SEM 100 according to FIG. 1 or 2, or the combination apparatus 200 according to FIG. 3 or 4, and/or of the particle beam apparatus 400 according to FIG. 5 or 6 and/or of the beam apparatus 501 according to FIG. 7 includes the processor unit 127. Loaded in the processor unit 127 is a computer program product having a program code which, upon execution, carries out a method for operating the SEM 100 according to FIG. 1 or 2, the combination apparatus 200 according to FIG. 3 or 4, the particle beam apparatus 400 according to FIG. 5 or 6 and/or the beam apparatus 501 according to FIG. 7. Embodiments of the method according to the system described herein are explained hereinbelow in relation to the combination apparatus 200 according to FIG. 3 or 4. Corresponding statements apply in relation to the SEM 100 according to FIG. 1 or 2, the particle beam apparatus 400 according to FIG. 5 or 6 and the beam apparatus 501 according to FIG. 7.

Figure 10:
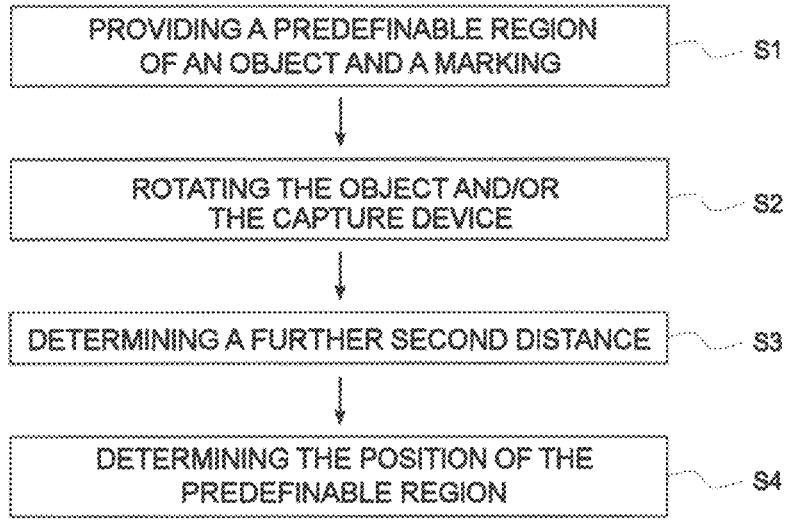
FIG. 10 is a schematic illustration of a procedure of a first embodiment of a method for determining a position of an object.

FIG. 10 shows one embodiment of the method according to the system described herein, which method serves for determining a position of a predefinable region of the object 125 in the combination apparatus 200. Method step S1 involves providing firstly a predefinable region of the object 125 and secondly a marking in the combination apparatus 200.

The marking can be arranged for example on the object 125 and/or on the object holder 114 on which the object 125 is arranged. In one embodiment of the method according to the system described herein, provision is made for the marking to be generated by ablating material from the object 125 and/or from the object holder 114. In addition or as an alternative thereto, provision is made for the marking to be generated by applying material to the object 125 and/or to the object holder 114. By way of example, the marking is generated as a cross-shaped marking, as a polygon, as a star-shaped marking, as an X-shaped marking and/or as an L-shaped marking. The invention is not restricted to the aforementioned embodiments of the marking. Rather, any marking that is suitable can be used for the invention. By way of example, the marking is configured as a distinctive structure of the object 125 or of the object holder 114.

The predefinable region of the object 125 is provided for example by identification of a region of interest of the object 125 in an image representation that was generated for example by the SEM 100 of the combination apparatus 200. In addition or as an alternative thereto, provision is made for the coordinates of the predefinable region of the object 125 to be ascertained by other analysis methods and to be input into the control unit 123.

Figure 11:
FIG. 11 is a schematic illustration of a predefinable region of an object and a marking.
Figure 11:
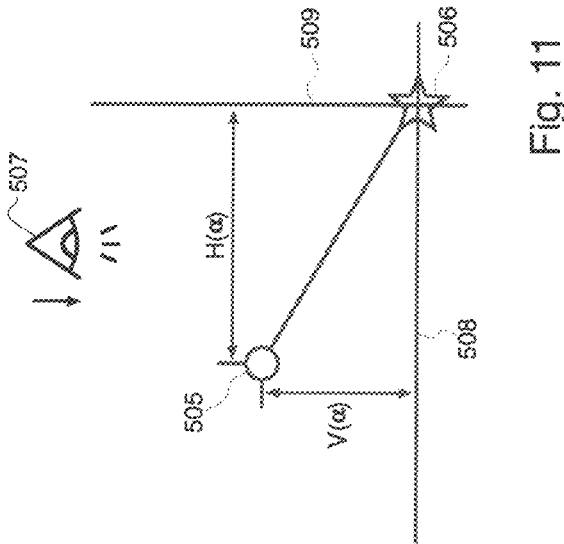

FIG. 11 shows a schematic illustration of the predefinable region 505 of the object 125 and the marking 506. The reference sign 507 designates a schematic illustration of the capture device, which views both the predefinable region 505 of the object 125 and the marking 506 in the direction of the arrow. By way of example, the electron source 101 of the SEM 100 of the combination apparatus 200, which electron source generates the electron beam, can also be arranged at the position of the capture device 507. The electron beam is then guided both to the predefinable region 505 of the object 125 and to the marking 506 in the direction of the arrow. The predefinable region 505 of the object 125 has a first position relative to the marking 506.

The first position is given by a first distance $V(\alpha)$ and a second distance $H(\alpha)$. The angle $\alpha$ is an already predefined tilt angle of a tilting about the first rotation axis in the form of the first stage rotation axis 603 of the object stage 122 or a predefined angle for a specific perspective. The angle $\alpha$ basically determines an initial position of the object stage 122 and/or of the capture device 507. From this initial position, the object stage 122 and/or the capture device 507 are/is moved into a new position. In the case of the schematic illustration shown in FIG. 11, the angle $\alpha$ is 0°, for example. In other embodiments, the angle $\alpha$ is different than 0°.

The first distance $V(\alpha)$ is given as the distance between the predefinable region 505 of the object 125 and a first straight line 508 running through the marking 506. The second distance $H(\alpha)$ is given as the distance between the predefinable region 505 of the object 125 and a second straight line 509 running through the marking 506. The first straight line 508 and the second straight line 509 are arranged at a first angle with respect to one another, which first angle is different than 0° and 180°. In one embodiment of the system described herein, provision is made, for example, for the first distance $V(\alpha)$ to extend along a first axis of a coordinate system and for the second distance $H(\alpha)$ to extend along a second axis of the coordinate system. In particular, the coordinate system is configured as a two-dimensional or three-dimensional coordinate system. By way of example, the coordinate system is a coordinate system with the marking 506 at the origin of the coordinate system. In one embodiment of the system described herein, the first distance $V(\alpha)$ is for example a vertical distance (proceeding from the first straight line 508). Furthermore, the second distance $H(\alpha)$ is for example a horizontal distance (proceeding from the second straight line 509).

The first distance $V(\alpha)$ and the second distance $H(\alpha)$ are determined for example in one embodiment of the method according to the system described herein or are determined for example before the method according to the system described herein is carried out. In particular, the first distance $V(\alpha)$ and/or the second distance $H(\alpha)$ can be determined by manual measurement using an image representation both of the predefinable region 505 of the object 125 and of the marking 506 using imaging by the SEM 100 of the combination apparatus 200. In addition or as an alternative thereto, the first distance $V(\alpha)$ and/or the second distance $H(\alpha)$ can be determined by use of image recognition software with the image representation both of the predefinable region 505 of the object 125 and of the marking 506 using imaging by the SEM 100 of the combination apparatus 200.

In the embodiment of the method according to the system described herein according to FIG. 10, method step S2 then provides for rotating the object 125 using the object stage 122. A rotation of the object 125 can be brought about by a rotation of the object stage 122 and thus of the object holder 114. Hereinafter rotation of the object holder 114 is also referred to as rotation of the object 125 with the object stage 122.

The object stage 122 is rotated about the first rotation axis in the form of the first stage rotation axis 603 out of the initial position, which is determined by the angle $\alpha$, by a predefinable first rotation angle $\delta\alpha_1$. In addition or as an alternative thereto, provision is made for the capture device 507 to be tilted out of the initial position, determined by the angle $\alpha$, about a second rotation axis and by the predefinable second rotation angle $\delta\alpha_2$.

The total rotation angle $\delta\alpha$ is given by $\delta\alpha=\delta\alpha_1+\delta\alpha_2$, for example, where $\delta\alpha_1$ is the proportion of a rotation of the object stage 122 and $\delta\alpha_2$ is the proportion of a rotation of the capture device 507 if the rotation of the capture device 507 is used. The aforementioned definition applies for example to all mentions of da made below, specifically to all embodiments mentioned herein. Consequently, the total rotation angle is $\alpha+\delta\alpha$.

The first rotation axis is aligned at a second angle with respect to the first beam axis 709 of the combination apparatus 200, where the second angle is different than 0° and 180°. To put it another way, the object stage 122 and thus the object holder 114 and also the object 125 are tilted about the first rotation axis in the form of the first stage rotation axis 603.

Figure 12:
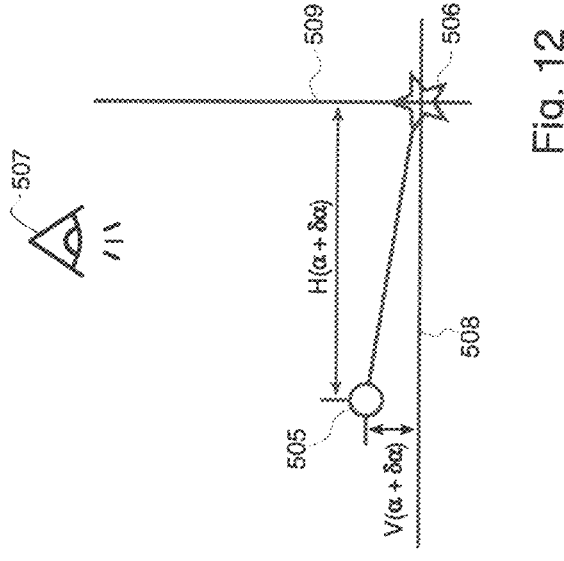
FIG. 12 is a further schematic illustration of a predefinable region of an object and a marking.

By rotating the capture device 507 about the second rotation axis, an axis of the capture device 507 along which both the predefinable region 505 of the object 125 and the marking 506 are viewed is rotated as well. The capture device 507 is basically rotated relative to the first beam axis 709 of the SEM 100. A change of perspective occurs in relation to the first beam axis 709 of the SEM 100. To put it another way, the capture device 507 views the predefinable region 505 of the object 125 and the marking 506 from a first perspective before the capture device 507 is rotated. After the capture device 507 has been rotated, the capture device 507 views the predefinable region 505 of the object 125 and the marking 506 from a second perspective. The first perspective is different than the second perspective. FIG. 12 shows a schematic illustration of the predefinable region 505 of the object 125 and the marking 506 after the rotation of the object 125 and/or the capture device 507.

In the embodiment of the method according to the system described herein according to FIG. 10, method step S3 then provides for, after rotating the object 125 and/or after rotating the capture device 507, determining a further second distance H($\alpha+\delta\alpha$) between the predefinable region 505 of the object 125 and the second straight line 509 using the processor unit 127. By way of example, the further second distance H($\alpha+\delta\alpha$) can be determined by manual measurement using an image representation both of the predefinable region 505 of the object 125 and of the marking 506 using the SEM 100 of the combination apparatus 200 after rotating the object 125 and/or after rotating the capture device 507. In addition or as an alternative thereto, the further second distance H($\alpha+\delta\alpha$) can be determined by use of image recognition software with the image representation both of the predefinable region 505 of the object 125 and of the marking 506 using the SEM 100 of the combination apparatus 200, where the image representation is generated after rotating the object 125 and/or after rotating the capture device 507.

On the basis of the method according to the system described herein, the actual position of the predefinable region 505 can be determined for example for any arbitrary rotation angle of the object stage 122 and/or of the capture device 507. When the parameters described further above have been determined, all parameters are available for determining the actual position of the predefinable region 505 after a rotation of the object stage 122 and/or of the capture device 507. By way of example, in the embodiment of the method according to the system described herein according to FIG. 10, method step S4 provides for, after rotating the object 125 and/or after rotating the capture device 507, determining a second position of the predefinable region 505 of the object 125 relative to the marking 506 using the first distance V($\alpha$), the second distance H($\alpha$) and the further second distance H($\alpha+\delta\alpha$). The second position of the predefinable region 505 of the object 125 basically corresponds to the position adopted by the predefinable region 505 of the object 125 relative to the marking 506 after rotating the object 125 and/or after rotating the capture device 507.

It has been recognized that a determination of the position of the predefinable region 505 of the object 125 after a tilting of the object 125 about an axis (for example about the first stage rotation axis 603 mentioned above) can be attained sufficiently well as a result if first of all there is a referencing of the first position of the predefinable region 505 of the object 125 relative to the marking 506 by way of knowledge of the first distance V($\alpha$) and the second distance H($\alpha$). As explained above, the first distance V($\alpha$) can extend along a first axis of a coordinate system. Furthermore, the second distance H($\alpha$) can extend along a second axis of the coordinate system. In particular, the coordinate system is configured as a two-dimensional or three-dimensional coordinate system. The first distance V($\alpha$) is for example a vertical distance (proceeding from the first straight line 508). Furthermore, the second distance H($\alpha$) is for example a horizontal distance (proceeding from the second straight line 509). In order to determine the second (i.e. the actual)

position of the predefinable region 505 of the object 125 relative to the marking 506 after a rotation of the object 505 and/or after a rotation of the capture device 507, it is then sufficient, according to the system described herein, to ascertain the further second distance H($\alpha+\delta\alpha$) between the predefinable region 505 of the object 125 and the second straight line 509. It has been recognized that in order to determine the position of the predefinable region 505 of the object 125 relative to the marking 506 both before at least one of the aforementioned rotations and after at least one of the aforementioned rotations, it is always possible to view both the predefinable region 505 of the object 125 and the marking 506 along the second straight line 509. The second straight line 509 runs for example along the first beam axis 709 of the combination apparatus 200 or along an axis of the capture device 507. On account of the rotation of the object 125 and/or the rotation of the capture device 507, there is a displacement of the position of the predefinable region 505 of the object 125 relative to the marking 506 along the first beam axis 709 or along the axis of the capture device 507. For the determination of the second (i.e. the actual) position of the predefinable region 505 of the object 125 relative to the marking 506 after one of the aforementioned rotations, it is then sufficient, in addition to the initial referencing, to use the further second distance H($\alpha+\delta\alpha$) between the predefinable region 505 of the object 125 and the second straight line 509. It has been recognized that, for the determination of the second (i.e. the actual) position of the predefinable region 505 of the object 125 relative to the marking 506, it is then sufficient, in addition to the initial referencing (i.e. establishing or ascertaining the first distance V($\alpha$) and the second distance H($\alpha$)), to use the further second distance H($\alpha+\delta\alpha$) between the predefinable region 505 of the object 125 and the second straight line 509 for determining the actual position of the predefinable region 505 of the object 125 relative to the marking 506.

The system described herein thus ensures the determination of the actual position of a predefinable region 505 of the object 125 even after a tilting of the object 125 about an axis. It is thus possible to establish whether, after the tilting of the object 125, the predefinable region 505 of the object 125 (or the object 125 as such) is situated at a desired position. If this is not the case, it is possible, on the basis of the system described herein, to determine a displacement between the determined second position of the predefinable region 505 of the object 125 and the desired position of the predefinable region 505 of the object 125. The displacement between the determined second position of the predefinable region 505 of the object 125 and the desired position of the predefinable region 505 of the object 125 can then be compensated for. To put it another way, using the determined displacement between the determined second position of the predefinable region 505 of the object 125 and the desired position of the predefinable region 505 of the object 125, the predefinable region 505 of the object 125 can be brought into a new position (for example into the desired position) relative to the electron beam of the combination apparatus 200. This is done for example by moving the object stage 122 and thus the object holder 114 and/or by moving the electron beam of the combination apparatus 200. The electron beam is moved for example using at least one deflection device of the SEM 100 of the combination apparatus 200. Consequently, it is then possible to position the predefinable region 505 of the object 125 into a new position relative to the electron beam using the processor unit 127 depending on the determined second position of the predefinable region 505 of the object 125 by moving the object stage 122 and/or by moving the electron beam. The aforementioned description applies analogously to the ion beam as well.

Figure 13:
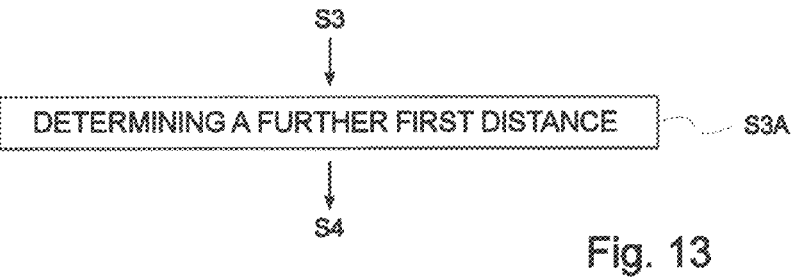
FIG. 13 is a schematic illustration of a procedure of a second embodiment of a method for determining a position of an object.

FIG. 13 shows a further embodiment of the method according to the system described herein. The embodiment in FIG. 13 is based on the embodiment in FIG. 10. Reference is made to the explanations given above, which apply here as well. In contrast to the embodiment in FIG. 10, the embodiment in FIG. 13 has a further method step S3A, which is carried out for example after method step S3 and before method step S4 of the embodiment of the method according to the system described herein illustrated in FIG. 10. In the embodiment of the method according to the system described herein illustrated in FIG. 13, provision is made for, after rotating the object 125 and/or after rotating the capture device 507, determining a further first distance V($\alpha$+$\delta\alpha$) between the predefinable region 505 of the object 125 and the first straight line 508 running through the marking 506. The second position of the predefinable region 505 of the object 125 relative to the marking 506 is then also determined using the further first distance V($\alpha$+$\delta\alpha$). Consequently, in the embodiment of the method according to the system described herein illustrated in FIG. 13, a further parameter, namely the further first distance V($\alpha$+$\delta\alpha$), is used in addition to the further second distance H($\alpha$+$\delta\alpha$) for determining the second position of the predefinable region 505 of the object 125 relative to the marking 506. The use of the further first distance V($\alpha$+$\delta\alpha$) is not absolutely necessary for determining the second position of the predefinable region 505 of the object 125 relative to the marking 506, but can indeed be used to determine the second position of the predefinable region 505 of the object 125 relative to the marking 506.

As mentioned above, the first distance V($\alpha$) is the distance between the predefinable region 505 of the object 125 and the first straight line 508 running through the marking 506 (see FIG. 11). In one embodiment of the system described herein, the first distance V($\alpha$) is for example the distance of a midpoint of the predefinable region 505 of the object 125 perpendicular to the first straight line 508. In particular, the midpoint is a center of an area, a centroid of an area or a center of mass of the predefinable region 505 of the object 125. As an alternative thereto, the first distance V($\alpha$) is the shortest distance of an edge of the predefinable region 505 of the object 125 perpendicular to the first straight line 508. The first distance V($\alpha$) is not restricted to the aforementioned examples. Rather, the first distance V($\alpha$) can be any distance between the predefinable region 505 of the object 125 and the first straight line 508 which is suitable for the system described herein. With regard to possible definitions of the further first distance V($\alpha$+$\delta\alpha$), the statements made above with regard to the first distance V($\alpha$) are applicable, mutatis mutandis.

As mentioned above, the second distance H($\alpha$) is given as the distance between the predefinable region 505 of the object 125 and the second straight line 509 running through the marking 506. In one embodiment of the system described herein, the second distance H($\alpha$) is for example the distance of a midpoint of the predefinable region 505 of the object 125 perpendicular to the second straight line 509. In particular, the midpoint is a center of an area, a centroid of an area or a center of mass of the predefinable region 505 of the object 125. As an alternative thereto, the second distance H($\alpha$) is the shortest distance of an edge of the predefinable region 505 of the object 125 perpendicular to the second straight line 509. The second distance H($\alpha$) is not restricted to the aforementioned examples. Rather, the second distance H($\alpha$) can be any distance between the predefinable region 505 of the object 125 and the first straight line which is suitable for the system described herein. With regard to possible definitions of the further second distance H($\alpha$+$\delta\alpha$), the statements made above with regard to the second distance H($\alpha$) are applicable, mutatis mutandis.

In a further embodiment of the method according to the system described herein, provision is additionally or alternatively made for the first straight line 508 and the second straight line 509 to be chosen in such a way that the first straight line 508 and the second straight line 509 are aligned at a first angle of 90° with respect to one another. In addition or as an alternative thereto, provision is made for the first straight line 508 and the second straight line 509 to be chosen in such a way that the first straight line 508 and/or the second straight line 509 run(s) through a center of the marking 506. By way of example, the center of the marking 506 is a centroid of an area or a center of mass. Yet again in addition or as an alternative thereto, provision is made for the first straight line 508 and the second straight line 509 to be chosen in such a way that an alignment and a position of the first straight line 508 and/or an alignment and position of the second straight line 509 do not change after rotating the object 125 and/or rotating the capture device 507. By way of example, the first straight line 508 and the second straight line 509 are each axes of a fixedly predefined two-dimensional or three-dimensional coordinate system. In particular, the aforementioned coordinate system is the coordinate system of the object holder 114 and/or of the object stage 122.

Figure 14:
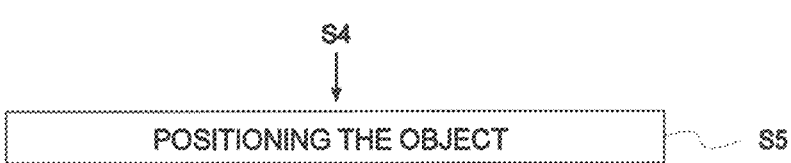
FIG. 14 is a schematic illustration of a procedure of a third embodiment of a method for determining a position of an object.

FIG. 14 shows a further embodiment of the method according to the system described herein. The embodiment in FIG. 14 is based on the embodiment in FIG. 10. Reference is made to the explanations given above, which apply here as well. In contrast to the embodiment in FIG. 10, the embodiment in FIG. 14 has a further method step S5, which is carried out after method step S4, for example. In the embodiment of the method according to the system described herein illustrated in FIG. 14, provision is made for the predefinable region 505 of the object 125, relative to the marking 506 and thus also relative to the electron beam of the SEM 100 and/or to the ion beam of the ion beam apparatus 300 of the combination apparatus 200, to be positioned into a new position relative to the marking 506 (and thus also relative to the electron beam and/or to the ion beam) using the processor unit 127 depending on the determined second position of the predefinable region 505 of the object 125 by movement of the object stage 122, by movement of the electron beam and/or by movement of the ion beam. The new position is for example the desired position after a compensation of a displacement of the position of the predefinable region 505 of the object 125 relative to the marking 506 after the rotation of the object 125 about the first rotation axis in the form of the first stage rotation axis 603 or after a rotation of the capture device 507 about the second rotation axis (i.e. after a change of perspective).

FIG. 15 shows a further embodiment of the method according to the system described herein, which method serves for determining a position of a predefinable region 505 of the object 125 in the combination apparatus 200. In this embodiment of the method according to the system described herein, the second distance H($\alpha$) and the further second distance H($\alpha$+$\delta\alpha$) are determined using two image representations both of the predefinable region 505 of the object 125 and of the marking 506.

Method step S100 involves providing firstly a predefinable region 505 of the object 125 and secondly a marking

506 in the combination apparatus 200. Reference is made to the explanations concerning FIG. 10, which apply here as well.

The marking 506 can be arranged for example on the object 125 and/or on the object holder 114 on which the object 125 is arranged. In one embodiment of the method according to the system described herein, provision is made for the marking 506 to be generated by ablating material from the object 125 and/or from the object holder 114. In addition or as an alternative thereto, provision is made for the marking 506 to be generated by applying material to the object 125 and/or to the object holder 114. By way of example, the marking 506 is generated as a cross-shaped marking, as a polygon, as a star-shaped marking, as an X-shaped marking and/or as an L-shaped marking. However, the invention is not restricted to the aforementioned embodiments of the marking 506. Rather, the marking 506 can have any configuration that is suitable for the invention. By way of example, the marking 506 is configured as a distinctive structure of the object 125 or of the object holder 114.

The predefinable region 505 of the object 125 is provided for example by identification of a region of interest of the object 125 in an image representation that was generated for example by the SEM 100 of the combination apparatus 200. In addition or as an alternative thereto, provision is made for the coordinates of the predefinable region 505 of the object 125 to be determined by some other method and to be input into the control unit 123.

In the embodiment of the method according to the system described herein illustrated in FIG. 15, method step S101 provides for, before rotating the object 125 and/or before rotating the capture device 507, generating a first image representation both of the predefinable region 505 of the object 125 and of the marking 506 using the electron beam of the SEM 100 of the combination apparatus 200. For this purpose, the electron beam is guided to the object 125 and to the marking 506. By way of example, the electron beam is scanned over the predefinable region 505 of the object 125 and over the marking 506 using the scanning device 115. As explained above, interaction particles are detected in particular by the first detector 116, by the second detector 117 and by the chamber detector 500. The first image representation can be displayed for example on the monitor 124 of the combination apparatus 200. Furthermore, method step S101 involves determining the second distance H($\alpha$) between the predefinable region 505 of the object 125 and the second straight line 509 using the first image representation. Embodiments for determining the second distance H($\alpha$) using the first image representation are described in greater detail further below. In a further embodiment of the method according to the system described herein, provision is made for determining the first distance V($\alpha$) between the predefinable region 505 of the object 125 and the first straight line 508 using a further image representation. For this purpose, a further image representation is generated for example in method step S101. In particular, the electron beam is scanned over the predefinable region 505 of the object 125 and over the marking 506 using the scanning device 115. As explained above, interaction particles are detected in particular by the first detector 116, by the second detector 117 and by the chamber detector 500. The further image representation can be displayed for example on the monitor 124 of the combination apparatus 200. Furthermore, method step S101 involves determining the first distance V($\alpha$) between the predefinable region 505 of the object 125 and the first straight line 508 using the further image representation.

Method step S102 then provides for the object 125 to be rotated out of an initial position of the object stage 122 (and thus of the object 125) using the object stage 122. The initial position is illustrated in FIG. 11 and is distinguished by the fact that the object stage 122 is tilted by the angle $\alpha$. For example, the angle $\alpha$ is 0°. The object stage 122 is rotated about the first rotation axis in the form of the first stage rotation axis 603 by a predefinable first rotation angle $\delta\alpha_1$. In addition or as an alternative thereto, provision is made for the capture device 507 to be tilted out of the initial position, determined by the angle $\alpha$, about a second rotation axis and by the predefinable second rotation angle $\delta\alpha_2$.

The total rotation angle $\delta\alpha$ is given by $\delta\alpha=\delta\alpha_1+\delta\alpha_2$, for example, where $\delta\alpha_1$ is the proportion of a rotation of the object stage 122 and $\delta\alpha_2$ is the proportion of a rotation of the capture device 507 if the proportion of a rotation of the capture device 507 is used. The aforementioned definition applies for example to all mentions of da made below, specifically to all embodiments mentioned herein. Consequently, the total rotation angle is $\alpha+\delta\alpha$.

Accordingly, the object stage 122 is rotated about the first stage rotation axis 603 by a total angle of $\alpha+\delta\alpha$. The first rotation axis is aligned at a second angle with respect to the first beam axis 709 of the SEM 100 of the combination apparatus 200, where the second angle is different than 0° and 180°. The object stage 122 (and thus the object holder 114) and also the object 125 are tilted about the first stage rotation axis 603.

By rotating the capture device 507 about the second rotation axis, an axis of the capture device 507 along which both the predefinable region 505 of the object 125 and the marking 506 are viewed is rotated as well. The capture device 507 is basically rotated relative to the first beam axis 709 of the SEM 100. A change of perspective occurs in relation to the first beam axis 709 of the SEM 100. To put it another way, the capture device 507 views the predefinable region 505 of the object 125 and the marking 506 from a first perspective before the capture device 507 is rotated. After the capture device 507 has been rotated, the capture device 507 views the predefinable region 505 of the object 125 and the marking 506 from a second perspective. The first perspective is different than the second perspective. FIG. 12 shows a schematic illustration of the predefinable region 505 of the object 125 and the marking 506 after the rotation of the object 125 and/or the capture device 507.

Method step S103 provides for, after rotating the object 125 and/or after rotating the capture device 507, generating a second image representation both of the predefinable region 505 of the object 125 and of the marking 506 using the electron beam of the SEM 100 of the combination apparatus 200. For this purpose, too, the electron beam is guided along the first beam axis 709 of the SEM 100 of the combination apparatus 200 to the object 125 and to the marking 506. By way of example, the electron beam is scanned over the predefinable region 505 of the object 125 and over the marking 506 using the scanning device 115. As explained above, interaction particles are detected in particular by the first detector 116, the second detector 117 and the chamber detector 500. The second image representation can be displayed for example on the monitor 124 of the combination apparatus 200. Furthermore, method step S103 provides for determining a further second distance H($\alpha+\delta\alpha$) between the predefinable region 505 of the object 125 and the second straight line 509 using the second image representation. Embodiments for determining the further second distance $H(\alpha+\delta\alpha)$ using the second image representation are described in greater detail below. In a further embodiment of the method according to the system described herein, provision is made for determining the further first distance $V(\alpha+\delta\alpha)$ between the predefinable region 505 of the object 125 and the first straight line 508 using a further image representation. For this purpose, too, the electron beam is guided along the first beam axis 709 of the SEM 100 of the combination apparatus 200 to the object 125 and to the marking 506. By way of example, the electron beam is scanned over the predefinable region 505 of the object 125 and over the marking 506 using the scanning device 115. As explained above, interaction particles are detected in particular by the first detector 116, the second detector 117 and the chamber detector 500. The further image representation can be displayed for example on the monitor 124 of the combination apparatus 200. Furthermore, method step S103 provides for determining a further first distance $V(\alpha+\delta\alpha)$ between the predefinable region 505 of the object 125 and the first straight line 508 using the further image representation.

Method step S104 involves determining a displacement of a position of the predefinable region 505 of the object 125 in the first image representation with respect to a position of the predefinable region 505 of the object 125 in the second image representation from the difference between the second distance $H(\alpha)$ and the further second distance $H(\alpha+\delta\alpha)$. Moreover, in method step S105, determining the second position of the predefinable region 505 of the object 125 relative to the marking 506 is carried out using the displacement of the position of the predefinable region 505 of the object 125 in the first image representation with respect to a position of the predefinable region 505 of the object 125 in the second image representation.

In a further embodiment of the method according to the system described herein, provision is additionally or alternatively made for the first image representation to be generated when the object stage 122 is situated in a reference position. The reference position can be any position which is suitable as reference position. Further method steps of the method according to the system described herein are carried out proceeding from the reference position. In particular, provision is additionally or alternatively made for the object stage 122 firstly to be rotated about the first rotation axis in the form of the first stage rotation axis 603 into the reference position. When the object stage 122 is situated in the reference position, the first image representation is generated. In addition or as an alternative thereto, provision is made for rotating the object 125 to be carried out by rotating the object stage 122 about the first rotation axis and by the first rotation angle when the object stage 122 is situated in the reference position. After rotating the object 125, the second image representation both of the predefinable region 505 of the object 125 and of the marking 506 is generated using the electron beam of the SEM 100 of the combination apparatus 200. Yet again in addition or as an alternative thereto, provision is made for the object stage 122 firstly to be rotated about the first rotation axis into the reference position. Afterward, the object 125 is rotated by rotating the object stage 122 about the first rotation axis and by the first rotation angle. After rotating the object 125, the second image representation both of the predefinable region 505 of the object 125 and of the marking 506 is generated using the electron beam of the SEM 100 of the combination apparatus 200.

In yet another embodiment of the method according to the system described herein, the reference position is configured as a zero position. The zero position is distinguished by the fact that the object stage 122 is not rotated about the first rotation axis. In the zero position, the first rotation angle is thus 0°. In the embodiment of the method according to the system described herein where the reference position is configured as a zero position, provision is made, for example, for the first image representation both of the predefinable region 505 of the object 125 and of the marking 506 to be generated when the object stage 122 is situated in the zero position. In addition or as an alternative thereto, provision is made for the object stage 122 firstly to be rotated about the first rotation axis into the zero position. When the object stage 122 is then situated in the zero position, the first image representation both of the predefinable region 505 of the object 125 and of the marking 506 is generated. In addition or as an alternative thereto, provision is made for rotating the object 125 to be carried out by rotating the object stage 122 about the first rotation axis and by the first rotation angle when the object stage 122 is situated in the zero position. Rotating the object stage 122 and thus the object 125 is followed by generating the second image representation both of the predefinable region 505 of the object 125 and of the marking 506 using the electron beam of the SEM 100 of the combination apparatus 200. Yet again in addition or as an alternative thereto, provision is made for the object stage 122 and thus the object 125 to be rotated about the first rotation axis into the zero position. Afterward, the object 125 is rotated by rotating the object stage 122 about the first rotation axis and by the first rotation angle. After rotating the object stage 122 and thus the object 125, the second image representation both of the predefinable region 505 of the object 125 and of the marking 506 is generated using the electron beam of the SEM 100 of the combination apparatus 200.

In one embodiment of the method according to the system described herein, provision is additionally or alternatively made for determining the second distance $H(\alpha)$ to be carried out by manual measurement using the first image representation. In addition or as an alternative thereto, determining the second distance $H(\alpha)$ is carried out by automatic measurement using the first image representation and the processor unit 127 using an image recognition method. Furthermore, by way of example, the first distance $V(\alpha)$ is determined by manual measurement using the further image representation. In addition or as an alternative thereto, determining the first distance $V(\alpha)$ is carried out by automatic measurement using the further image representation and the processor unit 127 using an image recognition method.

In a further embodiment of the method according to the system described herein, provision is additionally or alternatively made for determining the further second distance $H(\alpha+\delta\alpha)$ to be carried out by manual measurement using the second image representation. In addition or as an alternative thereto, determining the further second distance $H(\alpha+\delta\alpha)$ is carried out by automatic measurement using the second image representation and the processor unit 127 using an image recognition method. Furthermore, by way of example, determining the further first distance $V(\alpha+\delta\alpha)$ is carried out by manual measurement using the further image representation. In addition or as an alternative thereto, determining the further first distance $V(\alpha+\delta\alpha)$ is carried out by automatic measurement using the further image representation and the processor unit 127 using an image recognition method.

FIG. 16 shows yet another embodiment of the method according to the system described herein, which method serves for determining a position of a predefinable region 505 of the object 125 in the combination apparatus 200. In the embodiment illustrated in FIG. 16 of the method according to the system described herein, the further second distance H(α+δα) is determined using three image representations both of the predefinable region 505 of the object 125 and of the marking 506.

Method step S200 involves providing firstly the predefinable region 505 of the object 125 and secondly the marking 506 in the combination apparatus 200. Reference is made to the explanations concerning FIG. 11, which apply here as well.

The marking 506 can be arranged for example on the object 125 and/or on the object holder 114 on which the object 125 is arranged. In one embodiment of the method according to the system described herein, provision is made for the marking 506 to be generated by ablating material from the object 125 and/or from the object holder 114. In addition or as an alternative thereto, provision is made for the marking 506 to be generated by applying material to the object 125 and/or to the object holder 114. By way of example, the marking 506 is generated as a cross-shaped marking, as a polygon, as a star-shaped marking, as an X-shaped marking and/or as an L-shaped marking. The invention is not restricted to the aforementioned embodiments of the marking. Rather, any marking that is suitable for the invention can be used for the invention. By way of example, the marking is configured as a distinctive structure of the object 125 or of the object holder 114.

The predefinable region 505 of the object 125 is provided for example by identification of a region of interest of the object 125 in an image representation that was generated in particular by the SEM 100 of the combination apparatus 200. In addition or as an alternative thereto, provision is made for the coordinates of the predefinable region 505 of the object 125 to be determined by some other method and to be input into the control unit 123.

In this embodiment of the method according to the system described herein, method step S201 provides for, before rotating the object 125 and/or before rotating the capture device 507, generating a first image representation both of the predefinable region 505 of the object 125 and of the marking 506 using the electron beam of the SEM 100 of the combination apparatus 200. For this purpose, the electron beam is guided to the object 125 and to the marking 506. By way of example, the electron beam is scanned over the predefinable region 505 of the object 125 and over the marking 506 using the scanning device 115. As explained above, interaction particles are detected in particular by the first detector 116, by the second detector 117 and by the chamber detector 500. The first image representation can be displayed for example on the monitor 124 of the combination apparatus 200. Furthermore, in method step S201, it is possible to determine the second distance H(α) between the predefinable region 505 of the object 125 and the second straight line 509 using the first image representation. Embodiments for determining the second distance H(α) using the first image representation are described in greater detail further below. In a further embodiment of the method according to the system described herein, provision is made, for example, for determining the first distance V(α) using a further image representation. For this purpose, the electron beam is guided to the object 125 and to the marking 506. By way of example, the electron beam is scanned over the predefinable region 505 of the object 125 and over the marking 506 using the scanning device 115. As explained above, interaction particles are detected in particular by the first detector 116, by the second detector 117 and by the chamber detector 500. The further image representation can be displayed for example on the monitor 124 of the combination apparatus 200. Furthermore, in method step S201, it is possible to determine the first distance V(α) between the predefinable region 505 of the object 125 and the first straight line 508 using the further image representation.

Method step S202 then provides for the object 125 to be rotated from an initial position of the object 125 (or of the object stage 122) in a first rotation direction using the object stage 122. The initial position is illustrated in FIG. 11. The object stage 122 is rotated about the first rotation axis in the form of the first stage rotation axis 603 by a predefinable first rotation angle $\delta\alpha_1$ in a first rotation direction. In addition or as an alternative thereto, provision is made for the capture device 507 to be tilted out of the initial position, determined by the angle α, about a second rotation axis and by the predefinable second rotation angle $\delta\alpha_2$. The total rotation angle δα is given by $\delta\alpha=\delta\alpha_1+\delta\alpha_2$, for example, where $\delta\alpha_1$ is the proportion of a rotation of the object stage 122 and $\delta\alpha_2$ is the proportion of a rotation of the capture device 507 if the proportion of a rotation of the capture device 507 is used. The aforementioned definition applies for example to all mentions of δα made below, specifically to all embodiments mentioned herein. Consequently, the total rotation angle is α+δα.

The first rotation axis is aligned at a second angle with respect to the first beam axis 709 of the combination apparatus 200, where the second angle is different than 0° and 180°. The object stage 122 and thus the object holder 114 and also the object 125 are tilted about the first stage rotation axis 603.

By rotating the capture device 507 about the second rotation axis, an axis of the capture device 507 along which both the predefinable region 505 of the object 125 and the marking 506 are viewed is rotated as well. The capture device 507 is basically rotated relative to the first beam axis 709 of the SEM 100. A change of perspective occurs in relation to the first beam axis 709 of the SEM 100. To put it another way, the capture device 507 views the predefinable region 505 of the object 125 and the marking from a first perspective before the capture device is rotated. After the capture device 507 has been rotated, the capture device views the predefinable region 505 of the object 125 and the marking 506 from a second perspective. The first perspective is different than the second perspective. FIG. 12 shows a schematic illustration of the predefinable region 505 of the object 125 and the marking 506 after the rotation of the object 125 and/or the capture device 507.

Method step S203 provides for, after rotating the object 125 and/or after rotating the capture device 507 in the first rotation direction, generating a second image representation both of the predefinable region 505 of the object 125 and of the marking 506 using the electron beam of the SEM 100 of the combination apparatus 200. For this purpose, too, the electron beam is guided along the first beam axis 709 of the SEM 100 of the combination apparatus 200 to the object 125 and to the marking 506. By way of example, the electron beam is scanned over the predefinable region 505 of the object 125 and over the marking 506 using the scanning device 115. As explained above, interaction particles are detected in particular by the first detector 116, by the second detector 117 and by the chamber detector 500. The second image representation can be displayed for example on the monitor 124 of the combination apparatus 200.

Method step S204 then provides for the object 125 to be rotated from the initial position of the object 125 (or of the object stage 122) in a second rotation direction using the object stage 122. The first rotation direction is opposite to the second rotation direction. By way of example, the first rotation direction proceeding from the initial position of the object stage 122 is a left rotation direction (in particular a rotation direction in the counterclockwise direction). By contrast, the second rotation direction proceeding from the initial position of the object stage 122 is for example a right rotation direction (in particular a rotation direction in the clockwise direction). The initial position is illustrated in FIG. 11. The object stage 122 is rotated about the first rotation axis in the form of the first stage rotation axis 603 by a predefinable third rotation angle $-(\delta\alpha)$ in the second rotation direction (i.e. with a total angle of $\alpha-\delta\alpha$). In addition or as an alternative thereto, provision is made for the capture device 507 to be tilted about a second rotation axis and by a predefinable fourth rotation angle $-(\delta\alpha)$ in the second rotation direction (i.e. with a total angle of $\alpha-\delta\alpha$). By rotating the capture device 507 about the second rotation axis, an axis of the capture device 507 along which both the predefinable region 505 of the object 125 and the marking 506 are viewed is rotated as well. The capture device 507 is basically rotated in relation to the first beam axis 709 of the SEM 100 of the combination apparatus 200. A change of perspective occurs in relation to the first beam axis 709 of the SEM 100 of the combination apparatus 200. Provision is preferably made for a rotation angle whose absolute value corresponds to that of the third rotation angle $-(\delta\alpha)$ and which therefore differs from the third rotation angle only in terms of the sign to be used as the first rotation angle $\delta\alpha$. The same applies, mutatis mutandis, to the second rotation angle and the fourth rotation angle.

Method step S205 provides for, after rotating the object 125 and/or after rotating the capture device 507 in the second rotation direction, generating a third image representation both of the predefinable region 505 of the object 125 and of the marking 506 using the electron beam of the SEM 100 of the combination apparatus 200. For this purpose, too, the electron beam is guided along the first beam axis 709 of the SEM 100 of the combination apparatus 200 to the object 125 and to the marking 506. By way of example, the electron beam is scanned over the predefinable region 505 of the object 125 and over the marking 506 using the scanning device 115. As explained above, interaction particles are detected in particular by the first detector 116, by the second detector 117 and by the chamber detector 500. The third image representation can be displayed for example on the monitor 124 of the combination apparatus 200.

Method step S206 involves determining a first displacement of a position of the predefinable region 505 of the object 125 in the first image representation with respect to the position of the predefinable region 505 of the object 125 in the second image representation. Moreover, method step S207 involves determining a second displacement of the position of the predefinable region 505 of the object 125 in the first image representation with respect to the position of the predefinable region 505 of the object 125 in the third image representation. Furthermore, method step S208 provides for determining the further second distance $H(\alpha+\delta\alpha)$ to be carried out using the aforementioned and determined first displacement of the position of the predefinable region 505 of the object 125 in the first image representation with respect to the position of the predefinable region 505 of the object 125 in the second image representation, the aforementioned and determined second displacement of the position of the predefinable region 505 of the object 125 in the first image representation with respect to the position of the predefinable region 505 of the object 125 in the third image representation, the first rotation angle da and/or the second rotation angle da. Moreover, method step S209 involves determining the second position of the predefinable region 505 of the object 125 relative to the marking 506.

In one embodiment of the method according to the system described herein in which three image representations are generated, provision is additionally or alternatively made for the first image representation to be generated when the object stage 122 is situated in a reference position. The reference position can be any position which is suitable as reference position. Further method steps of the method according to the system described herein are carried out proceeding from the reference position. In addition or as an alternative thereto, provision is made for the object stage 122 firstly to be rotated about the first rotation axis into the reference position. Afterward, the first image representation both of the predefinable region 505 of the object 125 and of the marking 506 is generated. Yet again in addition or as an alternative thereto, provision is made for rotating the object 125 to be carried out by rotating the object stage 122 by the first rotation angle $\delta\alpha$ in the first rotation direction proceeding from the reference position of the object stage 122. Afterward, the second image representation both of the predefinable region 505 of the object 125 and of the marking 506 is generated. Furthermore, provision is additionally or alternatively made for rotating the object 125 to be carried out by rotating the object stage 122 by the predefinable third rotation angle $-(\delta\alpha)$ in the second rotation direction proceeding from the reference position of the object stage 122. Afterward, the third image representation both of the predefinable region 505 of the object 122 and of the marking 506 is generated.

In a further embodiment of the method according to the system described herein in which three image representations are generated, the reference position is configured as a zero position. The zero position is distinguished by the fact that the object stage 122 is not rotated about the first rotation axis. The first rotation angle is 0° in the zero position. In this embodiment of the method according to the system described herein, provision is made, for example, for the first image representation both of the predefinable region 505 of the object 125 and of the marking 506 to be generated when the object stage 122 is situated in the zero position. In addition or as an alternative thereto, provision is made for the object stage 122 and thus the object 125 firstly to be rotated about the first rotation axis into the zero position. When the object stage 122 is situated in the zero position, the first image representation is generated. Yet again in addition or as an alternative thereto, provision is made for rotating the object to be carried out by rotating the object stage 122 by the predefinable first rotation angle da in the first rotation direction proceeding from the zero position of the object stage 122. Afterward, the second image representation both of the predefinable region 505 of the object 125 and of the marking is generated. Furthermore, in addition or as an alternative thereto, provision is made for rotating the object 125 to be carried out by rotating the object stage 122 by the predefinable third rotation angle $-(\delta\alpha)$ in the second rotation direction proceeding from the zero position of the object stage 122. Afterward, the third image representation both of the predefinable region 505 of the object 125 and of the marking 505 is generated.

In one embodiment of the method according to the system described herein in which three image representations are generated, provision is additionally or alternatively made for determining the first displacement of the position of the predefinable region 505 of the object 125 in the first image representation with respect to the position of the predefinable region 505 of the object 125 in the second image representation to be carried out by manual measurement using the first image representation and the second image representation. In addition or as an alternative thereto, provision is made for determining the first displacement of the position of the predefinable region 505 of the object 125 in the first image representation with respect to the position of the predefinable region 505 of the object 125 in the second image representation to be carried out by automatic measurement using the first image representation and the second image representation using the processor unit 127. Yet again in addition or as an alternative thereto, provision is made for determining the second displacement of the position of the predefinable region 505 of the object 125 in the first image representation with respect to the position of the predefinable region 505 of the object 125 in the third image representation to the carried out by manual measurement using the first image representation and the third image representation. Furthermore, provision is additionally or alternatively made for determining the second displacement of the position of the predefinable region 505 of the object 125 in the first image representation with respect to the position of the predefinable region 505 of the object 125 in the third image representation to be carried out by automatic measurement using the first image representation and the third image representation using the processor unit 127.

Considerations have revealed that, in one embodiment of the method according to the system described herein, the displacement between the position actually occupied by the predefinable region 505 of the object 125 relative to the marking 506 and a desired position of the predefinable region 505 of the object 125 for a specific first rotation angle ß can be calculated as follows:

$$\Delta(\beta) = A \cdot \sin(\beta) - B \cdot (1 - \cos(\beta))$$   [1]

where $\Delta$ is the aforementioned displacement between the position actually occupied by the predefinable region 505 of the object 125 relative to the marking 506 and a desired position of the predefinable region 505 of the object 125 as a function of the first rotation angle $\beta$, A is a proportion of the abovementioned displacement in a first direction (for example a vertical direction), and B is a proportion of the abovementioned displacement in a second direction (for example a horizontal direction). In particular, the first direction and the second direction are oriented perpendicular to one another.

Owing to the progression of the sine curve around the zero point, the first term $$A \cdot \sin(\beta)$$   [2]

changes sign upon a transition from positive first rotation angles to negative first rotation angles (or vice versa). This is different for the second term $$B \cdot (1 - \cos(\beta)).$$   [3]

Owing to the progression of the cosine curve around the zero point, the second term does not change sign upon a transition from positive first rotation angles to negative first rotation angles (or vice versa).

The displacement $\Delta(\beta)$ and the displacement $\Delta(-\beta)$ can be determined using the method according to the system described herein. With the aid of equation [1], the proportion A of the displacement in the first direction can now be determined, namely by:

$$\Delta(\beta) - \Delta(-\beta) =$$   [4]

$$(A \cdot \sin(\beta) - B \cdot (1 - \cos(\beta))) - (A \cdot \sin(-\beta) - (B \cdot (1 - \cos(-\beta))))$$

$$\Delta(\beta) - \Delta(-\beta) = 2 \cdot A \cdot \sin(\beta)$$   [5]

$$A = \frac{\Delta(\beta) - \Delta(-\beta)}{2 \cdot \sin(\beta)}$$   [6]

By virtue of the proportion A of the displacement in the first direction now being known, the proportion B of the displacement in the second direction can now be calculated, specifically from equation [1] solved with respect to the proportion B of the displacement in the second direction:

$$B = -\frac{\Delta(\beta) - A \cdot \sin(\beta)}{1 - \cos(\beta)}$$   [7]

The first proportion A and the second proportion B are thus determinable. Accordingly, it is possible to calculate the displacement as a function of any arbitrary first rotation angle $\beta$ using equation [1].

An explanation is given below as to how an arbitrary displacement is able to be ascertained using image recognition software, which is explained on the basis of the example of a displacement of the marking 506. Comparing a first image having both the predefinable region 505 of the object 125 and the marking 506 with a second image having both the predefinable region 505 of the object 125 and the marking 506 can be carried out by image recognition software, for example. Afterward, a displacement vector is determined using the comparison of the first image with the second image. By way of example, the mathematical method of cross correlation is used when determining the displacement vector. An embodiment of the method according to the system described herein using cross correlation is explained in more detail below. In the following embodiment of the method according to the system described herein, the marking 506 is configured as a polygon with edges. In particular, (a) the first image is generated, (b) after rotating the object 125, the second image is generated, and (c) a displacement between the first image and the second image is calculated using the processor unit 127.

The marking 506 can be defined by the coordinates $x_i$, $y_i$ of each node of the marking 506 in the form of the polygon. Using the coordinates of each node, a center of the area of the marking 506 can be calculated using the processor unit 127 using the following equations:

$$C_x = \frac{1}{6A} \sum_{i=0}^{n-1} (x_i + x_{i+1}) \cdot (x_i \cdot y_{i+1} - x_{i+1} \cdot y_i)$$   [8]

$$C_y = \frac{1}{6A} \sum_{i=0}^{n-1} (y_i + y_{i+1}) \cdot (x_i \cdot y_{i+1} - x_{i+1} \cdot y_i)$$   [9]

where A is the area of the polygon given by $$A = \frac{1}{2} \sum_{i=0}^{n-1} (x_i \cdot y_{i+1} - x_{i+1} \cdot y_i) \qquad [10]$$

The marking 506 in the form of the polygon includes the center of the area given by the coordinates $C_x$, $C_y$. The center of the area of the marking 506 in the first image is compared with the center of the area of the marking 506 in the second image.

A possible displacement of the center of the area is determined by correlating the first image with the second image. The displacement is specified by a displacement vector $(d_x, d_y)$. Using the displacement vector $(d_x, d_y)$, it is then possible to determine how the ion beam and/or the electron beam should be positioned in order to be incident again at the location on the object 125 on which the ion beam and/or the electron beam were/was incident prior to the movement of the object stage 122. The corresponding coordinates of the location onto which the ion beam and/or the electron beam are/is now guided are specified for example as follows:

$$\begin{pmatrix} x_i^* \\ y_i^* \end{pmatrix} = \begin{pmatrix} x_i \\ y_i \end{pmatrix} + \begin{pmatrix} d_x \\ d_y \end{pmatrix} \qquad [11]$$

None of the described embodiments of the method according to the invention are restricted to the abovementioned order of the explained method steps. Rather, any order of the abovementioned method steps that is suitable for the invention can be chosen in the method according to the invention, insofar as no particular order is stipulated in this description.

The features of the invention that are disclosed in the present description, in the drawings and in the claims may be essential for the implementation of the invention in its various embodiments both individually and in any desired combinations. The invention is not restricted to the described embodiments. The invention can be varied within the scope of the claims and taking into account the knowledge of those skilled in the relevant art.

The invention claimed is:

1. A method for determining a position of an object in a beam apparatus which has a processor unit that is used for processing, imaging and/or analyzing an object, the beam apparatus providing a first beam, the method comprising:

providing a predefinable region of the object and a marking in the beam apparatus, wherein the predefinable region has a first position in relation to the marking, the first position is given by a first distance and a second distance, the first distance being a distance between the predefinable region and a first straight line running through the marking and the second distance being a distance between the predefinable region and a second straight line running through the marking, wherein the first straight line and the second straight line are arranged at a first angle with respect to one another, the first angle being other than 0° and 180°;

rotating the object arranged on an object holder using an object stage, on which the object holder is arranged, wherein the object stage is rotated about a first rotation axis and by a predefinable first rotation angle, wherein the first rotation axis is aligned at a second angle with respect to an axis of the beam apparatus, the second angle being other than 0° and 180° and/or rotating a capture device of the beam apparatus about a second rotation axis and by a predefinable second rotation angle;

determining a further second distance between the predefinable region and the second straight line using the processor unit; and determining a second position of the predefinable region of the object in relation to the marking using the first distance, the second distance and the further second distance.

2. The method as claimed in claim 1, wherein after rotating the object and/or after rotating the capture device, a further first distance between the predefinable region of the object and the first straight line running through the marking is determined and wherein determining the second position of the predefinable region of the object in relation to the marking is carried out using the further first distance.

3. The method as claimed in claim 1, further including at least one of the following features:

the first straight line and the second straight line are chosen in such a way that the first straight line and the second straight line are aligned such that the first angle is 90°;

the first straight line and the second straight line are chosen in such a way that the first straight line and/or the second straight line run(s) through a center of the marking;

the first straight line and the second straight line are chosen in such a way that an alignment and a position of the first straight line and/or an alignment and position of the second straight line do not change after rotating the object and/or rotating the capture device.

4. The method as claimed in claim 1, wherein the object is positioned into a new position in relation to the first beam of the beam apparatus using the processor unit depending on the determined second position by moving the object stage and/or moving the first beam of the beam apparatus.

5. The method as claimed in claim 1, further comprising:

before rotating the object and/or before rotating the capture device, generating a first image representation both of the predefinable region of the object and of the marking using the first beam of the beam apparatus, wherein the first beam is guided along an optical axis of the beam apparatus to the object and to the marking, wherein the marking is arranged on the object and/or on the object holder and determining the second distance between the predefinable region of the object and the second straight line using the first image representation;

after rotating the object and/or after rotating the capture device generating a second image representation both of the predefinable region of the object and of the marking using the first beam of the beam apparatus, wherein the first beam is guided along the optical axis of the beam apparatus to the object and to the marking and wherein determining the further second distance between the predefinable region and the second straight line using the second image representation is carried out;

determining a displacement of a position of the predefinable region of the object in the first image representation with respect to a position of the predefinable region of the object in the second image representation from the difference between the second distance and the further second distance; and determining the second position of the predefinable region of the object in relation to the marking is carried out using the displacement of the position of the predefinable region of the object in the first image representation with respect to the position of the predefinable region of the object in the second image representation.

6. The method as claimed in claim 5, further comprising at least one of the following:

generating the first image representation comprises detecting interaction particles using at least one detector, wherein the interaction particles result from an interaction between the first beam of the beam apparatus and the object; and/or the first image representation is displayed on a display unit of the beam apparatus.

7. The method as claimed in claim 6, further comprising at least one of the following:

generating the second image representation comprises detecting interaction particles using the detector, wherein the interaction particles result from the interaction between the first beam of the beam apparatus and the object (125, 425); and/or the second image representation is displayed on the display unit of the beam apparatus.

8. The method as claimed in claim 5, further comprising at least one of the following:

the first image representation is generated when the object stage is situated in a reference position;

the object stage is rotated about the first rotation axis into the reference position and the first image representation is generated only when the object stage is situated in the reference position;

rotating the object is carried out by rotating the object stage by the first rotation angle when the object stage is situated in the reference position; and/or the object stage is rotated about the first rotation axis into the reference position and afterward the object is rotated by rotating the object stage by the first rotation angle.

9. The method as claimed in claim 5, further comprising at least one of the following:

the first image representation is generated when the object stage is not rotated about the first rotation axis and the object stage is situated in a zero position;

the object stage is rotated about the first rotation axis into the zero position, in which the object stage is not rotated in relation to the first rotation axis, and the first image representation is generated when the object stage is situated in the zero position;

rotating the object is carried out by rotating the object stage by the first rotation angle when the object stage is situated in the zero position; and/or the object stage is rotated about the first rotation axis into the zero position and afterward the object is rotated by rotating the object stage by the first rotation angle.

10. The method as claimed in claim 5, wherein determining the second distance is carried out by manual measurement using the first image representation and/or by automatic measurement using the first image representation and the processor unit using an image recognition method.

11. The method as claimed in claim 5, wherein determining the further second distance is carried out by manual measurement using the second image representation and/or by automatic measurement using the second image representation and the processor unit using an image recognition method.

12. The method as claimed in claim 5, further comprising at least one of the following:

determining the displacement of the position of the predefinable region of the object in the first image representation with respect to the position of the predefinable region of the object in the second image representation is carried out using the processor unit;

determining the second distance is carried out using the processor unit;

determining the further second distance is carried out using the processor unit; and/or determining the position of the predefinable region of the object is carried out using the processor unit.

13. The method as claimed in claim 1, further comprising:

before rotating the object and/or before rotating the capture device, generating a first image representation both of the predefinable region of the object and of the marking using the first beam of the beam apparatus, wherein the beam is guided along an optical axis of the beam apparatus to the object and to the marking, wherein the marking is arranged on the object and/or on the object holder;

rotating the object is carried out by rotating the object stage about the first rotation axis of the object stage by the first rotation angle in a first rotation direction;

generating a second image representation both of the predefinable region of the object and of the marking using the first beam of the beam apparatus after rotating the object, wherein the beam is guided along the optical axis of the beam apparatus to the object and to the marking;

rotating the object by rotating the object stage about the first rotation axis of the object stage by a third rotation angle in a second rotation direction;

generating a third image representation both of the predefinable region of the object and of the marking using the first beam of the beam apparatus after rotating the object, wherein the beam is guided along the optical axis of the beam apparatus to the object and to the marking;

determining a first displacement of a position of the predefinable region of the object in the first image representation with respect to the position of the predefinable region of the object in the second image representation;

determining a second displacement of the position of the predefinable region of the object in the first image representation with respect to the position of the predefinable region of the object in the third image representation; and determining the further second distance is carried out using the first displacement of the position of the predefinable region of the object in the first image representation with respect to the position of the predefinable region of the object in the second image representation, the second displacement of the position of the predefinable region of the object in the first image representation with respect to the position of the predefinable region of the object in the third image representation, the first rotation angle and/or the second rotation angle.

14. The method as claimed in claim 13, further comprising at least one of the following:

generating the first image representation by detecting interaction particles using at least one detector, wherein the interaction particles result from an interaction between the first beam of the beam apparatus and the object;

the first image representation is displayed on a display unit of the beam apparatus;

generating the second image representation by detecting interaction particles using the detector, wherein the interaction particles result from the interaction between the first beam of the beam apparatus and the object;

displaying the second image representation on the display unit of the beam apparatus;

generating the third image representation by detecting interaction particles using the detector, wherein the interaction particles result from the interaction between the first beam of the beam apparatus and the object; and/or displaying the third image representation on the display unit of the beam apparatus.

15. The method as claimed in claim 13, further comprising at least one of the following:

generating the first image representation when the object stage is situated in a reference position;

rotating the object stage about the first rotation axis into the reference position, and carrying out the process of generating the first image representation;

rotating the object by rotating the object stage by the first rotation angle in the first rotation direction proceeding from the reference position of the object stage; and/or rotating the object by rotating the object stage by the predefinable third rotation angle in the second rotation direction proceeding from the reference position of the object stage.

16. The method as claimed in claim 13, further comprising at least one of the following:

generating the first image representation when the object stage is not rotated in relation to the first rotation axis and is situated in a zero position;

rotating the object stage about the first rotation axis into the zero position, in which the object stage is not rotated in relation to the first rotation axis, and carrying out the process of generating the first image representation when the object stage is situated in the zero position;

rotating the object by rotating the object stage by the predefinable first rotation angle in the first rotation direction proceeding from the zero position of the object stage; and/or rotating the object by rotating the object stage by the predefinable third rotation angle in the second rotation direction proceeding from the zero position of the object stage.

17. The method as claimed in claim 13, further comprising at least one of the following:

a rotation direction opposite to the second rotation direction is used as the first rotation direction; and/or a rotation angle having an absolute value corresponding to an absolute value of the third rotation angle and which differs from the third rotation angle only in terms of a sign is used as the first rotation angle.

18. The method as claimed in claim 13, further comprising at least one of the following:

determining the first displacement of the position of the predefinable region of the object in the first image representation with respect to the position of the predefinable region of the object in the second image representation by manual measurement using the first image representation and the second image representation;

determining the first displacement of the position of the predefinable region of the object in the first image representation with respect to the position of the predefinable region of the object in the second image representation by automatic measurement using the first image representation and the second image representation using the processor unit;

determining the second displacement of the position of the predefinable region of the object in the first image representation with respect to the position of the predefinable region of the object in the third image representation by manual measurement using the first image representation and the third image representation; and/or determining the second displacement of the position of the predefinable region of the object in the first image representation with respect to the position of the predefinable region of the object in the third image representation by automatic measurement using the first image representation and the third image representation using the processor unit.

19. The method as claimed in claim 13, further comprising at least one of the following:

determining the second distance by manual measurement using the first image representation;

determining the second distance by automatic measurement using the first image representation and the processor unit and using an image recognition method;

determining the further second distance by manual measurement using the first image representation, the second image representation and the third image representation; and/or determining the further second distance by automatic measurement using the first image representation, the second image representation, the third image representation and the processor unit using an image recognition method.

20. The method as claimed in claim 1, wherein the beam apparatus provides a second beam, wherein the object is imaged, processed and/or analyzed after determining the second position of the predefinable region of the object and/or after positioning the object using the second beam.

21. The method as claimed in claim 1, wherein a light microscope, a laser beam apparatus and/or a particle beam apparatus are/is used as the beam apparatus.

22. The method as claimed in claim 1, wherein a user's eye and/or a camera unit are/is used as the capture device.

23. A non-transitory computer readable medium containing software which is loadable into a processor unit and which, when executed, controls a beam apparatus, the software comprising:

executable code that facilitates providing a predefinable region of an object and a marking in the beam apparatus, wherein the predefinable region has a first position in relation to the marking, the first position is given by a first distance and a second distance, the first distance being a distance between the predefinable region and a first straight line running through the marking and the second distance being a distance between the predefinable region and a second straight line running through the marking, wherein the first straight line and the second straight line are arranged at a first angle with respect to one another, the first angle being other than 0° and 180°;

executable code that rotates the object arranged on an object holder using an object stage, on which the object holder is arranged, wherein the object stage is rotated about a first rotation axis and by a predefinable first rotation angle, wherein the first rotation axis is aligned at a second angle with respect to an axis of the beam apparatus, the second angle being other than 0° and 180° and/or rotating a capture device of the beam apparatus about a second rotation axis and by a predefinable second rotation angle;

executable code that determines a further second distance between the predefinable region and the second straight line using the processor unit; and executable code that determines a second position of the predefinable region of the object in relation to the marking using the first distance, the second distance and the further second distance.

24. The computer program product as claimed in claim 23, wherein the beam apparatus is configured as a particle beam apparatus, and/or wherein the beam apparatus is configured as an electron beam apparatus and/or as an ion beam apparatus and/or as a light microscope and/or as a laser beam apparatus.

25. A beam apparatus for processing, imaging and/or analyzing an object, comprising a first beam generator that generates a first beam;

a first objective lens that focuses the first beam on the object;

at least one movable object stage that is used to arrange the object;

at least one display device that displays an image of the object and/or an analysis regarding the object;

at least one capture device that images the object; and at least one control unit having a processor unit that is coupled to a non-transitory computer readable medium containing software that includes executable code that facilitates providing a predefinable region of the object and a marking in the beam apparatus, wherein the predefinable region has a first position in relation to the marking, the first position is given by a first distance and a second distance, the first distance being a distance between the predefinable region and a first straight line running through the marking and the second distance being a distance between the predefinable region and a second straight line running through the marking, wherein the first straight line and the second straight line are arranged at a first angle with respect to one another, the first angle being other than 0° and 180°, executable code that rotates the object arranged on an object holder using an object stage, on which the object holder is arranged, wherein the object stage is rotated about a first rotation axis and by a predefinable first rotation angle, wherein the first rotation axis is aligned at a second angle with respect to an axis of the beam apparatus, the second angle being other than 0° and 180° and/or rotating a capture device of the beam apparatus about a second rotation axis and by a predefinable second rotation angle, executable code that determines a further second distance between the predefinable region and the second straight line using the processor unit, and executable code that determines a second position of the predefinable region of the object in relation to the marking using the first distance, the second distance and the further second distance.

26. The beam apparatus as claimed in claim 25, wherein the beam apparatus is configured as a particle beam apparatus;

the beam generator is configured as a particle beam generator that generates a particle beam with charged particles;

the particle beam apparatus has at least one scanning device that scans the particle beam over the object; and wherein the particle beam apparatus has at least one detector that detects interaction particles, wherein the interaction particles result from an interaction between the particle beam and the object.

27. The beam apparatus as claimed in claim 25, further comprising:

at least one second beam generator that generates a second beam; and at least one second objective lens that focuses the second beam onto the object.

28. The beam apparatus as claimed in claim 25, wherein the beam apparatus is configured as a light microscope, as an electron beam apparatus, as an ion beam apparatus and/or as a laser beam apparatus.

* * * * *